United States Patent
Horiuchi et al.

(10) Patent No.: US 12,029,052 B2
(45) Date of Patent: Jul. 2, 2024

(54) SOLAR CELL MODULE, ELECTRONIC DEVICE, AND POWER SUPPLY MODULE

(71) Applicants: Tamotsu Horiuchi, Kyoto (JP); Takahiro Ide, Shizuoka (JP); Yuuji Tanaka, Shizuoka (JP); Nozomu Tamoto, Shizuoka (JP); Naomichi Kanei, Shizuoka (JP); Masana Shiba, Shizuoka (JP)

(72) Inventors: Tamotsu Horiuchi, Kyoto (JP); Takahiro Ide, Shizuoka (JP); Yuuji Tanaka, Shizuoka (JP); Nozomu Tamoto, Shizuoka (JP); Naomichi Kanei, Shizuoka (JP); Masana Shiba, Shizuoka (JP)

(73) Assignee: Ricoh Company, Ltd., Tokyo (JP)

(*) Notice: Subject to any disclaimer, the term of this patent is extended or adjusted under 35 U.S.C. 154(b) by 82 days.

(21) Appl. No.: 17/597,573

(22) PCT Filed: Jul. 15, 2020

(86) PCT No.: PCT/JP2020/027561
§ 371 (c)(1),
(2) Date: Jan. 12, 2022

(87) PCT Pub. No.: WO2021/010425
PCT Pub. Date: Jan. 21, 2021

(65) Prior Publication Data
US 2023/0189540 A1  Jun. 15, 2023

(30) Foreign Application Priority Data
Jul. 16, 2019 (JP) .................................. 2019-130902

(51) Int. Cl.
*H10K 30/40* (2023.01)
*H01L 27/142* (2014.01)
(Continued)

(52) U.S. Cl.
CPC ............ *H10K 30/40* (2023.02); *H01L 27/142* (2013.01); *H10K 30/81* (2023.02); *H10K 30/86* (2023.02); *H10K 39/18* (2023.02)

(58) Field of Classification Search
CPC ... H01L 31/0465; H01L 27/142; H10K 30/40; H10K 30/86; H10K 39/12; H02S 40/38
See application file for complete search history.

(56) References Cited

U.S. PATENT DOCUMENTS 9,318,270 B2    4/2016  Horiuchi et al.
2017/0069431 A1  3/2017  Tanaka et al.
(Continued)

FOREIGN PATENT DOCUMENTS

CN    103746078       4/2014
EP    3419067 A1     12/2018
(Continued)

OTHER PUBLICATIONS

Machine translation of KR20200143898A (Year: 2020).*
(Continued)

*Primary Examiner* — Ryan S Cannon
(74) *Attorney, Agent, or Firm* — Grüneberg and Myers PLLC

(57) ABSTRACT

A solar cell module includes a first substrate and a plurality of photoelectric conversion elements disposed on the first substrate. Each of the plurality of photoelectric conversion elements includes a first electrode, an electron transport layer, a perovskite layer, a hole transport layer, and a second electrode. In at least two of the photoelectric conversion elements adjacent to each other, the hole transport layers are extended continuous layers; and the first electrodes, the electron transport layers, and the perovskite layers in the at least two of the photoelectric conversion elements adjacent to each other are separated by the hole transport layer. The
(Continued)

hole transport layer includes, as hole transport material, a polymer having a weight average molecular weight of 2,000 or more or a compound having a molecular weight of 2,000 or more.

9 Claims, 6 Drawing Sheets

(51) Int. Cl.
*H10K 30/81* (2023.01)
*H10K 30/86* (2023.01)
*H10K 39/18* (2023.01)

(56) References Cited

U.S. PATENT DOCUMENTS

| | | | |
|---|---|---|---|
| 2017/0092433 | A1 | 3/2017 | Kanei et al. |
| 2018/0096797 | A1 | 4/2018 | Satou et al. |
| 2019/0019628 | A1 | 1/2019 | Higuchi |
| 2019/0019843 | A1 | 1/2019 | Fujinuma et al. |
| 2019/0074461 | A1 | 3/2019 | Ding et al. |
| 2019/0198259 | A1* | 6/2019 | Aranami ............... H01L 31/046 |
| 2019/0348731 | A1* | 11/2019 | Innes ............... H01M 8/0656 |
| 2020/0066458 | A1 | 2/2020 | Matsuyama et al. |
| 2020/0152812 | A1* | 5/2020 | Bush ............... H01L 31/0687 |

FOREIGN PATENT DOCUMENTS

| | | | |
|---|---|---|---|
| JP | 2005-243379 | | 9/2005 |
| JP | 2007-13115 | | 1/2007 |
| JP | 2016-167520 | | 9/2016 |
| JP | 2016-195175 | | 11/2016 |
| JP | 2020-053616 | | 4/2020 |
| KR | 20200143898 | A * | 12/2020 |
| WO | WO2016/186317 | A1 | 11/2016 |
| WO | WO2016/208578 | A1 | 12/2016 |
| WO | WO2020/067188 | A1 | 4/2020 |

OTHER PUBLICATIONS

International Search Report Issued Oct. 26, 2020 for counterpart International Patent Application No. PCT/JP2020/027561 filed Jul. 15, 2020.
Written Opinion Issued Oct. 26, 2020 for counterpart International Patent Application No. PCT/JP2020/027561 filed Jul. 5, 2020.
Artiom Magomedov et al, "Diphenylamine-Substituted Carbazole-Based Hole Transporting Materials for Perovskite Solar Cells: Influence of Isomeric Derivatives", Advanced Functional Materials, vol. 28, No. 9, Jan. 19, 2018 (Jan. 19, 2018), p. 1704351, XP055739670.
Huang H. et al, "Synthesis and Photophysical Properties Of Alternating Copolymers Containing Triphenylamine Moieties", Polymers for Advanced Technologies, John Wiley & Sons, Bognor Regis, GB, vol. 14, No. 3-05, Apr. 23, 2003 (Apr. 23, 2003), p. 309-313, XP001170489.
Japanese Office Action dated Apr. 9, 2024, in Japanese Application No. 2020- 121841, 3 pages.

* cited by examiner

SOLAR CELL MODULE, ELECTRONIC DEVICE, AND POWER SUPPLY MODULE

CROSS-REFERENCE TO RELATED APPLICATIONS

This application is the National Stage entry under § 371 of International Application No. PCT/JP2020/027561, filed on Jul. 15, 2020, and which claims the benefit of priority to Japanese Application No. 2019-130902, filed on Jul. 16, 2019. The content of each of these applications is hereby incorporated by reference in its entirety.

TECHNICAL FIELD

The present disclosure relates to a solar cell module, an electronic device, and a power supply module.

BACKGROUND ART

In recent years, solar cells using a photoelectric conversion element have been expected to be widely applied not only in terms of alternative to fossil fuels and measures against global warming but also as self-supporting power supplies that require neither replacement of a cell nor power source wirings. Moreover, the solar cells as the self-supporting power supplies attract much attention as one of energy harvesting techniques required in internet of things (IoT) devices or artificial satellites.

Examples of the solar cells include organic solar cells such as dye-sensitized solar cells, organic thin film solar cells, and perovskite solar cells, as well as inorganic solar cells using silicon that have been widely conventionally used.

The perovskite solar cells are advantageous in terms of improvement of safety and inhibition of production cost, because they can be produced with the conventionally existing printing units without using an electrolyte containing, for example, an organic solvent.

Regarding the organic thin film solar cells and the perovskite solar cells, it is known that a plurality of photoelectric conversion elements that are spatially separated are electrically connected so as to form a series circuit to increase output voltage (see, for example, PTL 1).

CITATION LIST

Patent Literature

PTL 1: Japanese Unexamined Patent Application Publication No. 2016-195175

SUMMARY OF INVENTION

Technical Problem

An object of the present disclosure is to provide a solar cell module that can maintain power generation efficiency even after exposure to light having a high illuminance for a long period of time.

Solution to Problem

According to one aspect of the present disclosure, a solar cell module includes: a first substrate; and a plurality of photoelectric conversion elements disposed on the first substrate. Each of the plurality of photoelectric conversion elements includes a first electrode, an electron transport layer, a perovskite layer, a hole transport layer, and a second electrode. In at least two of the photoelectric conversion elements adjacent to each other, the hole transport layers are extended continuous layers. The first electrodes, the electron transport layers, and the perovskite layers in the at least two of the photoelectric conversion elements adjacent to each other are separated by the hole transport layer. The hole transport layer includes, as hole transport material, a polymer having a weight average molecular weight of 2,000 or more or a compound having a molecular weight of 2,000 or more.

Advantageous Effects of Invention

According to the present disclosure, it is possible to provide a solar cell module that can maintain power generation efficiency even after exposure to light having a high illuminance for a long period of time.

DESCRIPTION OF EMBODIMENTS (Solar Cell Module)

Figure 1:
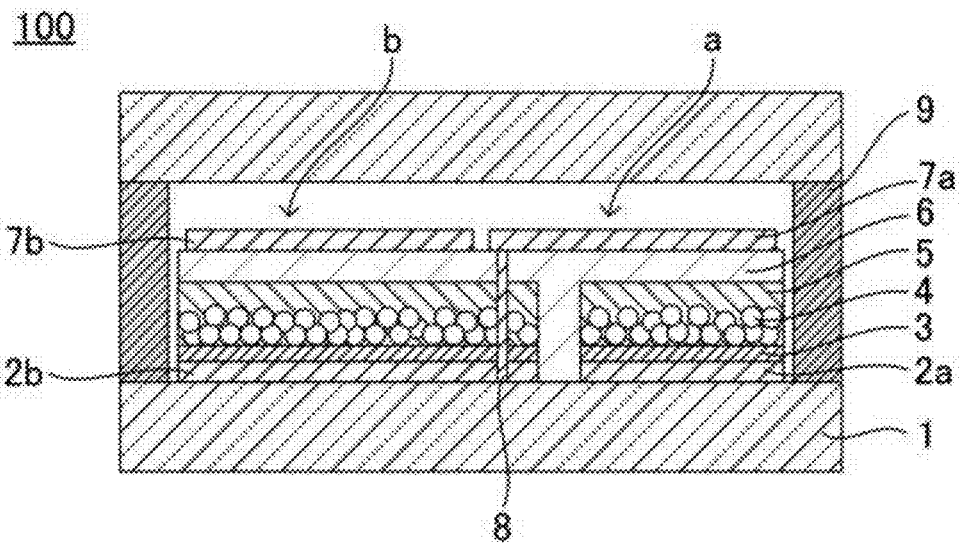
FIG. 1 is an explanatory view presenting one example of a structure of a solar cell module of the present disclosure.

A solar cell module of the present disclosure includes: a first substrate; and a plurality of photoelectric conversion elements disposed on the first substrate. Each of the plurality of photoelectric conversion elements includes a first electrode, an electron transport layer, a perovskite layer, a hole transport layer, and a second electrode. In at least two of the photoelectric conversion elements adjacent to each other, the hole transport layers are extended continuous layers, and the first electrodes, the electron transport layers, and the perovskite layers in the at least two of the photoelectric conversion elements adjacent to each other by the hole transport layer. The hole transport layer includes, as hole transport material, a polymer having a weight average molecular weight of 2,000 or more or a compound having a molecular weight of 2,000 or more.

A solar cell module of the present disclosure is based on the finding that the existing solar cell modules having perovskite layers are drastically decreased in power generation efficiency after exposure to light having a high illuminance for a long period of time. Specifically, in the existing solar cell modules having perovskite layers, because a porous titanium oxide layer or a perovskite layer is extended, such a configuration causes much recombination of electrons through diffusion and drastically decreases power generation efficiency after exposure to light having a high illuminance for a long period of time, which is problematic.

As another problem, the hole transport layer and the second electrode are exfoliated because adhesiveness between the hole transport layer and the second electrode is low, which is problematic in terms of durability for a long period of time.

Meanwhile, regarding the solar cell module of the present disclosure, the hole transport layers are extended continuous layers, and the first electrodes, the electron transport layers, and the perovskite layers are separated by the hole transport layer in the at least two of the photoelectric conversion elements adjacent to each other. Therefore, in the solar cell module of the present disclosure, the first electrodes, the porous titanium oxide layers, and the perovskite layers are separated by the hole transport layer, and the hole transport layer includes, as hole transport material, a polymer having a weight average molecular weight of 2,000 or more or a compound having a molecular weight of 2,000 or more. As a result, since less recombination of electrons through diffusion is caused, power generation efficiency can be maintained even after exposure to light having a high illuminance for a long period of time, and durability is drastically increased.

A solar cell module of the present disclosure includes a first substrate and a plurality of photoelectric conversion elements disposed on the first substrate, preferably further includes a second substrate different from the aforementioned substrate and a sealing member, and includes other members if necessary.

<Substrate>

A shape, a structure, and a size of the first substrate are not particularly limited and may be appropriately selected depending on the intended purpose.

A material of the first substrate is not particularly limited and may be appropriately selected depending on the intended purpose, so long as it has translucency and insulation. Examples of the material include glass, plastic films, and ceramics. Among them, in the case where a baking step for forming an electron transport layer as described below is included, a material having heat resistance to a baking temperature is preferable. Moreover, preferable examples of the first substrate include those having a flexibility.

<Photoelectric Conversion Element>

The photoelectric conversion element means an element that can convert light energy into electric energy, and is applied to, for example, solar cells and photodiodes.

The photoelectric conversion element of the present disclosure includes at least a first electrode, an electron transport layer, a perovskite layer, a hole transport layer, and a second electrode.

<<First Electrode>>

A shape and a size of the first electrode are not particularly limited and may be appropriately selected depending on the intended purpose, so long as the first electrodes in at least two photoelectric conversion elements adjacent to each other are separated by a hole transport layer that will be described hereinafter.

A structure of the first electrode is not particularly limited and may be appropriately selected depending on the intended purpose. The structure of the first electrode may be a single layer structure or a structure where a plurality of materials are laminated.

A material of the first electrode is not particularly limited and may be appropriately selected depending on the intended purpose, so long as the material is a material having conductivity. Examples of the material include transparent conductive metal oxides, carbon, and metals.

Examples of the transparent conductive metal oxide include indium-tin oxide (referred to as "ITO" hereinafter), fluorine-doped tin oxide (referred to as "FTO" hereinafter), antimony-doped tin oxide (referred to as "ATO" hereinafter), niobium-doped tin oxide (referred to as "NTO" hereinafter), aluminum-doped zinc oxide, indium-zinc oxide, and niobium-titanium oxide.

Examples of the carbon include carbon black, carbon nanotube, graphene, and fullerene. Examples of the metal include gold, silver, aluminum, nickel, indium, tantalum, and titanium. These may be used alone or in combination. Among them, transparent conductive metal oxide having high transparency is preferable, ITO, FTO, ATO, and NTO are more preferable.

An average thickness of the first electrode is not particularly limited and may be appropriately selected depending on the intended purpose. The average thickness of the first electrode is preferably 5 nm or more but 100 m or less, more preferably 50 nm or more but 10 m or less. When a material of the first electrode is carbon or metal, the average thickness of the first electrode is preferably an average thickness enough for obtaining translucency.

The first electrode can be formed by known methods such as sputtering, vapor deposition, and spraying.

Moreover, the first electrode is preferably formed on the first substrate. It is possible to use an integrated commercially available product where the first electrode has been formed on the first substrate in advance.

Examples of the integrated commercially available product include FTO coated glass, ITO coated glass, zinc oxide/aluminum coated glass, an FTO coated transparent plastic film, and an ITO coated transparent plastic film. Other examples of the integrated commercially available product include: glass substrates provided with a transparent electrode where tin oxide or indium oxide is doped with a cation or an anion having a different atomic value; and glass substrates provided with a metal electrode having such a structure that allows light in the form of a mesh or stripes to pass.

These may be used alone, or two or more products may be used in combination as a combined product or a laminate. Moreover, a metal lead wire may be used in combination in order to decrease an electric resistance value.

A material of the metal lead wire is, for example, aluminum, copper, silver, gold, platinum, and nickel.

The metal lead wire can be used in combination by forming it on the substrate through, for example, vapor deposition, sputtering, or pressure bonding, and disposing a layer of ITO or FTO thereon, or by forming it on ITO or FTO.

<<Electron Transport Layer>>

The electron transport layer means a layer that transports, to the first electrode, electrons generated in a perovskite layer that will be described hereinafter. Therefore, the electron transport layer is preferably disposed adjacent to the first electrode.

A shape and a size of the electron transport layer are not particularly limited and may be appropriately selected depending on the intended purpose, so long as the electron transport layers in at least two photoelectric conversion elements adjacent to each other are separated by a hole transport layer that will be described hereinafter.

When the electron transport layers in at least two photoelectric conversion elements adjacent to each other are separated by the hole transport layer, diffusion of electrons is prevented to decrease leakage of electric current. As a result, light durability can be improved.

A structure of the electron transport layer may be a single layer or a multilayer formed by laminating a plurality of layers. However, the structure thereof is preferably a multilayer. The structure thereof is more preferably formed of a layer having a compact structure (compact layer) and a layer having a porous structure (porous layer). In addition, the compact layer is preferably disposed closer to the first electrode than the porous layer.

—Compact Layer—

The compact layer is not particularly limited and may be appropriately selected depending on the intended purpose, so long as it includes an electron transport material and is more compact than a porous layer that will be described hereinafter. Here, being more compact than the porous layer means that a packing density of the compact layer is higher than a packing density of particles of which the porous layer is formed.

The electron transport material is not particularly limited and may be appropriately selected depending on the intended purpose, but is preferably a semiconductor material.

The semiconductor material is not particularly limited and known materials may be used. Examples of the semiconductor material include simple substance semiconductors and compounds having compound semiconductors.

Examples of the simple substance semiconductor include silicon and germanium.

Examples of the compound semiconductor include chalcogenide of metal. Specific examples thereof include: oxides of titanium, tin, zinc, iron, tungsten, zirconium, hafnium, strontium, indium, cerium, yttrium, lanthanum, vanadium, niobium, and tantalum; sulfides of cadmium, zinc, lead, silver, antimony, and bismuth; selenides of cadmium and lead; and telluride of cadmium. Other examples of the compound semiconductor include: phosphides of zinc, gallium, indium, and cadmium; gallium arsenide; copper-indium-selenide; and copper-indium-sulfide. Among them, oxide semiconductors are preferable. Particularly, titanium oxide, zinc oxide, tin oxide, and niobium oxide are more preferably included.

These may be used alone or in combination. Moreover, a crystal type of the semiconductor material is not particularly limited and may be appropriately selected depending on the intended purpose. The crystal type thereof may be a single crystal, polycrystalline, or amorphous.

A film thickness of the compact layer is not particularly limited and may be appropriately selected depending on the intended purpose. The film thickness of the compact layer is preferably 5 nm or more but 1 m or less, more preferably 10 nm or more but 700 nm or less.

A method for producing the compact layer is not particularly limited and may be appropriately selected depending on the intended purpose. Examples of the method include a method for forming a thin film under vacuum (vacuum film formation method) and a wet film formation method.

Examples of the vacuum film formation method include a sputtering method, a pulse laser deposition method (PLD method), an ion beam sputtering method, an ion assisted deposition method, an ion plating method, a vacuum deposition method, an atomic layer deposition method (ALD method), and a chemical vapor deposition method (CVD method).

Examples of the wet film formation method include a sol-gel method. The sol-gel method is the following method. Specifically, a solution is allowed to undergo a chemical reaction such as hydrolysis or polymerization·condensation to prepare gel. Then, it is subjected to a heat treatment to facilitate compactness. When the sol-gel method is used, a method for coating the sol solution is not particularly limited and may be appropriately selected depending on the intended purpose. Examples thereof include a dip method, a spraying method, a wire bar method, a spin coating method, a roller coating method, a blade coating method, a gravure coating method, and wet printing methods such as relief printing, offset printing, gravure printing, intaglio printing, rubber plate printing, and screen printing. A temperature at which the heat treatment is performed after the sol solution is coated is preferably 80 degrees Celsius or more, more preferably 100 degrees Celsius or more.

—Porous Layer—

The porous layer is not particularly limited and may be appropriately selected depending on the intended purpose, so long as it is a layer that includes an electron transport material and is less compact (i.e., porous) than the compact layer. Note that, being less compact than the compact layer means that a packing density of the porous layer is lower than a packing density of the compact layer.

The electron transport material is not particularly limited and may be appropriately selected depending on the intended purpose, but is preferably a semiconductor material similarly to the case of the compact layer. As the semiconductor material, the same materials as the materials used in the compact layer can be used.

In addition, the electron transport material constituting the porous layer has a form of particles, and these particles are preferably joined to form a porous film.

A number average particle diameter of primary particles of the electron transport material is not particularly limited and may be appropriately selected depending on the intended purpose. The number average particle diameter thereof is preferably 1 nm or more but 100 nm or less, more preferably 10 nm or more but 50 nm or less. Moreover, a semiconductor material having a lager particle size than the number average particle diameter may be mixed or laminated. Use of such a semiconductor material may improve a conversion efficiency because of an effect of scattering incident light. In this case, the number average particle diameter thereof is preferably 50 nm or more but 500 nm or less.

As the electron transport material in the porous layer, titanium oxide particles can be suitably used. When the electron transport material in the porous layer is titanium oxide particles, the conduction band is high, which makes it possible to obtain a high open-circuit voltage. When the electron transport material in the porous layer is the titanium oxide particles, the refractive index is high, and a high short circuit current can be obtained because of an effect of confining light. Moreover, when the electron transport material in the porous layer is the titanium oxide particles, it is advantageous because the permittivity of the porous layer becomes high and the mobility of the electrons becomes high to obtain a high fill factor (shape factor). That is, the electron transport layer preferably includes the porous layer including titanium oxide particles because the open-circuit voltage and the fill factor can be improved.

An average thickness of the porous layer is not particularly limited and may be appropriately selected depending on the intended purpose. The average thickness thereof is preferably 30 nm or more but 1 m or less, more preferably 100 nm or more but 600 nm or less. Moreover, the porous layer may include a multilayer structure. The porous layer having a multilayer structure can be produced by coating a dispersion liquid of particles of the electron transport material different in a particle diameter several times, or by coating a dispersion liquid of the electron transport material, a resin, and an additive different in formulation several times. It is effective to coat the dispersion liquid of particles of the electron transport material several times when an average thickness (film thickness) of the porous layer is adjusted.

A method for producing the porous layer is not particularly limited and may be appropriately selected depending on the intended purpose. Examples of the method include an immersion method, a spin coating method, a spraying method, a dip method, a roller method, and an air knife method. As the method for producing the porous layer, a precipitation method using a supercritical fluid such as carbon dioxide can be used.

A method for producing the particles of the electron transport material is, for example, a mechanically pulverizing method using a known milling apparatus. Through this method, it is possible to prepare a dispersion liquid of the semiconductor material by dispersing, in water or a solvent, an electron transport material in the form of particles alone or a mixture of the semiconductor material and a resin.

Examples of the resin include polymers or copolymers of vinyl compounds (e.g., styrene, vinyl acetate, acrylic acid ester, and methacrylic acid ester), silicone resins, phenoxy resins, polysulfone resins, polyvinyl butyral resins, polyvinyl formal resins, polyester resins, cellulose ester resins, cellulose ether resins, urethane resins, phenol resins, epoxy resins, polycarbonate resins, polyarylate resins, polyamide resins, and polyimide resins. These may be used alone or in combination.

Examples of the solvent include water, alcohol solvents, ketone solvents, ester solvents, ether solvents, amide solvents, halogenated hydrocarbon solvents, and hydrocarbon solvents.

Examples of the alcohol solvent include methanol, ethanol, isopropyl alcohol, and α-terpineol.

Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diethyl ether, dimethoxy ethane, tetrahydrofuran, dioxolane, and dioxane.

Examples of the amide solvent include N,N-dimethylformamide, N,N-dimethylacetoamide, and N-methyl-2-pyrrolidone.

Examples of the halogenated hydrocarbon solvent include dichloromethane, chloroform, bromoform, methyl iodide, dichloroethane, tirchloroethane, trichloroethylene, chlorobenzene, o-dichlorobenzene, fluorobenzene, bromobenzene, iodobenzene, and 1-chloronaphthalene.

Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

These may be used alone or in combination.

To the dispersion liquid including the electron transport material or the paste including the electron transport material obtained by, for example, the sol-gel method, acid, a surfactant, or a chelating agent may be added in order to prevent reaggregation of the particles.

Examples of the acid include hydrochloric acid, nitric acid, and acetic acid.

Examples of the surfactant include polyoxyethylene octylphenyl ether.

Examples of the chelating agent include acetyl acetone, 2-aminoethanol, and ethylene diamine. Moreover, addition of a thickener is also an effective means for the purpose of improving film forming ability.

Examples of the thickener include polyethylene glycol, polyvinyl alcohol, and ethyl cellulose.

After the electron transport material is coated, it is possible to electronically contact particles of the electron transport material with each other, followed by baking, irradiation of microwave or electron beams, or irradiation of laser light in order to improve strength of the film and adhesiveness to the substrate. These treatments may be performed alone or in combination.

When the porous layer formed of the electron transport material is baked, a baking temperature is not particularly limited and may be appropriately selected depending on the intended purpose. However, the baking temperature thereof is preferably 30 degrees Celsius or more but 700 degrees Celsius or less, more preferably 100 degrees Celsius or more but 600 degrees Celsius or less. When the baking temperature thereof is 30 degrees Celsius or more but 700 degrees Celsius or less, the porous layer can be baked while the first substrate is prevented from being increased in a resistance value and being melted. The baking time is not particularly limited and may be appropriately selected depending on the intended purpose, but is preferably 10 minutes or more but 10 hours or less.

When the porous layer formed of the electron transport material is irradiated with microwave, the irradiation time is not particularly limited and may be appropriately selected depending on the intended purpose, but is preferably 1 hour or less. In this case, light may be emitted from a surface side on which the porous layer is formed, and light may be emitted from a surface side on which the porous layer is not formed.

After the porous layer formed of the electron transport material is baked, a chemical plating treatment using a mixed solution of an aqueous titanium tetrachloride solution or an organic solvent or an electrochemical plating treatment using an aqueous titanium trichloride solution may be performed for the purpose of increasing a surface area of the porous layer.

In this way, the film obtained by, for example, baking the electron transport material having a diameter of several tens of nanometers has a porous structure having many voids.

The porous structure has a considerably high surface area and the surface area can be represented by a roughness factor. The roughness factor is a numerical value presenting an actual area of the inside of the porous bodies relative to an area of particles of the electron transport material coated on the first substrate or the compact layer. Therefore, a larger roughness factor is preferable, but the roughness factor is preferably 20 or more in terms of relationship between the roughness factor and an average thickness of the electron transport layer.

The particles of the electron transport material may be doped with a lithium compound. A specific method thereof is a method in which a solution of a lithium bis(trifluoromethanesulfonimide) compound is deposited on the particles of the electron transport material through, for example, spin coating, followed by a baking treatment.

The lithium compound is not particularly limited and may be appropriately selected depending on the intended purpose. Examples of the lithium compound include lithium bis (trifluoromethanesulfonimide), lithium perchlorate, and lithium iodide.

—Perovskite Layer—

The perovskite layer means a layer that includes a perovskite compound. Therefore, the perovskite layer is preferably disposed adjacent to the electron transport layer.

A shape and a size of the perovskite layer are not particularly limited and may be appropriately selected depending on the intended purpose, so long as the perovskite layers in at least two photoelectric conversion elements adjacent to each other are separated by a hole transport layer that will be described hereinafter.

The perovskite compound is a composite substance of an organic compound and an inorganic compound, and is represented by the following General Formula (A).

$$X\alpha Y\beta M\gamma \qquad \text{General Formula (A)}$$

In the above General Formula (A), a ratio of $\alpha:\beta:\gamma$ is 3:1:1, and $\beta$ and $\gamma$ represent an integer of more than 1. For example, X can be a halogen ion, Y can be an ion of an alkyl amine compound, and M can be a metal ion.

X in the above General Formula (A) is not particularly limited and may be appropriately selected depending on the intended purpose. Examples thereof include halogen ions such as chlorine, bromine, and iodine. These may be used alone or in combination.

Y in the above General Formula (A) is, for example, an ion of an alkyl amine compound (e.g., methylamine, ethylamine, n-butylamine, and formamidine), cesium, potassium, and rubidium. These may be used alone or in combination.

In the case of the perovskite compound of lead halide and methylammonium, a peak λmax of the optical absorption spectrum is about 350 nm when the halogen ion is Cl, the peak λmax is about 410 nm when the halogen ion is Br, and the peak λmax is about 540 nm when the halogen ion is I. As described above, the peak λmax is shifted to a longer wavelength side, so a usable spectrum width (band width) varies.

M in the above General Formula (A) is not particularly limited and may be appropriately selected depending on the intended purpose. Examples thereof include metals such as lead, indium, antimony, tin, copper, and bismuth. These may be used alone or in combination.

The perovskite layer preferably has a laminated perovskite structure where a layer formed of metal halide and a layer of arranged organic cation molecules are alternatively laminated.

The perovskite layer preferably includes at least one selected from the group consisting of an alkali metal and an antimony atom. Inclusion of at least one of an alkali metal and an antimony atom in the perovskite layer is advantageous because the output becomes high.

A method for forming the perovskite layer is not particularly limited and may be appropriately selected depending on the intended purpose. Examples of the method include a method in which a solution that dissolves or disperses metal halide and halogenated alkylamine is coated, followed by drying.

Moreover, examples of the method for forming the perovskite layer include a two-step precipitation method as described below. Specifically, a solution that dissolves or disperses metal halide is coated and then is dried. Then, the resultant is immersed in a solution that dissolves halogenated alkylamine to form the perovskite compound.

Moreover, examples of the method for forming the perovskite layer include a method for precipitating crystals by adding a poor solvent (solvent having a small solubility) for the perovskite compound while the solution that dissolves or disperses metal halide and halogenated alkylamine being coated. In addition, examples of the method for forming the perovskite layer include a method for depositing metal halide in a gas filled with, for example, methylamine. Among them, preferable is the method for precipitating crystals by adding a poor solvent for the perovskite compound while the solution that dissolves or disperses metal halide and halogenated alkylamine being coated.

A method for coating the solution is not particularly limited and may be appropriately selected depending on the intended purpose. Examples of the method include an immersion method, a spin coating method, a spraying method, a dip method, a roller method, and an air knife method. As the method for coating the solution, a precipitation method in a supercritical fluid using, for example, carbon dioxide may be used.

Moreover, the perovskite layer may include a sensitizing dye.

A method for forming the perovskite layer including the sensitizing dye is not particularly limited and may be appropriately selected depending on the intended purpose. Examples of the method include: a method in which the perovskite compound and the sensitizing dye are mixed; and a method in which the perovskite layer is formed, followed by adsorbing the sensitizing dye.

The sensitizing dye is not particularly limited and may be appropriately selected depending on the intended purpose, so long as it is a compound photoexcited by excitation light to be used.

Examples of the sensitizing dye include: metal-complex compounds described in, for example, Japanese Translation of PCT International Application Publication No. JP-T-07-500630, Japanese Unexamined Patent Application Publication No. 10-233238, Japanese Unexamined Patent Application Publication No. 2000-26487, Japanese Unexamined Patent Application Publication No. 2000-323191, and Japanese Unexamined Patent Application Publication No. 2001-59062; coumarin compounds described in, for example, Japanese Unexamined Patent Application Publication No. 10-93118, Japanese Unexamined Patent Application Publication No. 2002-164089, Japanese Unexamined Patent Application Publication No. 2004-95450, and J. Phys. Chem. C, 7224, Vol. 111 (2007); polyene compounds described in, for example, Japanese Unexamined Patent Application Publication No. 2004-95450, and Chem. Commun., 4887 (2007); indoline compounds described in, for example, Japanese Unexamined Patent Application Publication No. 2003-264010, Japanese Unexamined Patent Application Publication No. 2004-63274, Japanese Unexamined Patent Application Publication No. 2004-115636, Japanese Unexamined Patent Application Publication No. 2004-200068, Japanese Unexamined Patent Application Publication No. 2004-235052, J. Am. Chem. Soc., 12218, Vol. 126 (2004), Chem. Commun., 3036 (2003), and Angew. Chem. Int. Ed., 1923, Vol. 47 (2008); thiophene compounds described in, for example, J. Am. Chem. Soc., 16701, Vol. 128 (2006), and J. Am. Chem. Soc., 14256, Vol. 128 (2006); cyanine dyes described in, for example, Japanese Unexamined Patent Application Publication No. 11-86916, Japanese Unexamined Patent Application Publication No. 11-214730, Japanese Unexamined Patent Application Publication No. 2000-106224, Japanese Unexamined Patent Application Publication No. 2001-76773, and Japanese Unexamined Patent Application Publication No. 2003-7359; merocyanine dyes described in, for example, Japanese Unexamined Patent Application Publication No. 11-214731, Japanese Unexamined Patent Application Publication No. 11-238905, Japanese Unexamined Patent Application Publication No. 2001-52766, Japanese Unexamined Patent Application Publication No. 2001-76775, and Japanese Unexamined Patent Application Publication No. 2003-7360; 9-aryl xanthene compounds described in, for example, Japanese Unexamined Patent Application Publication No. 10-92477, Japanese Unexamined Patent Application Publication No. 11-273754, Japanese Unexamined Patent Application Publication No. 11-273755, and Japanese Unexamined Patent Application Publication No. 2003-31273; triarylmethane compounds described in, for example, Japanese Unexamined Patent Application Publication No. 10-93118, and Japanese Unexamined Patent Application Publication No. 2003-31273; and phthalocyanine compounds and porphyrin compounds described in, for example, Japanese Unexamined Patent Application Publication No. 09-199744, Japanese Unexamined Patent Application Publication No. 10-233238, Japanese Unexamined Patent Application Publication No. 11-204821, Japanese Unexamined Patent Application Publication No. 11-265738, J. Phys. Chem., 2342, Vol. 91 (1987), J. Phys. Chem. B, 6272, Vol. 97 (1993), Electroanal. Chem., 31, Vol. 537 (2002), Japanese Unexamined Patent Application Publication No. 2006-032260, J. Porphyrins Phthalocyanines, 230, Vol. 3 (1999), Angew. Chem. Int. Ed., 373, Vol. 46 (2007), and Langmuir, 5436, Vol. 24 (2008). Among them, metal-complex compounds, indoline compounds, thiophene compounds, and porphyrin compounds are preferable.

<<Hole Transport Layer>>

The hole transport layer means a layer that transports holes generated in the perovskite layer to a second electrode that will be described hereinafter. Therefore, the hole transport layer is preferably disposed adjacent to the perovskite layer.

A shape and a size of the hole transport layer are not particularly limited and may be appropriately selected depending on the intended purpose, so long as the hole transport layers are extended continuous layers and the hole transport layer can separate the first electrodes, the electron transport layers, and the perovskite layers in at least two photoelectric conversion elements adjacent to each other.

By separating the first electrodes, the electron transport layers, and the perovskite layers by the hole transport layers that are extended continuous layers in the at least two photoelectric conversion elements adjacent to each other, the porous titanium oxide layers are separated, and less recombination of electrons through diffusion is caused, which makes it possible to maintain power generation efficiency even after exposure to light having a high illuminance for a long period of time.

The hole transport layer includes, as hole transport material, a polymer having a weight average molecular weight of 2,000 or more or a compound having a molecular weight of 2,000 or more, and further includes other components if necessary.

—Polymer Having Weight Average Molecular Weight of 2,000 or More—

The polymer having a weight average molecular weight of 2,000 or more is not particularly limited and may be appropriately selected depending on the intended purpose, so long as it is a hole transport material. Examples of the polymer having a weight average molecular weight of 2,000 or more include polythiophene compounds, polyphenylene vinylene compounds, polyfluorene compounds, polyphenylene compounds, polyarylamine compounds, and polythiadiazole compounds. Among them, considering the carrier mobility and the ionization potential, polythiophene compounds, polyarylamine compounds, and polymers including a recurring unit represented by General Formula (1) or (2) below are preferable, polymers including a recurring unit represented by General Formula (1) or (2) below are particularly preferable.

Note that, the weight average molecular weight is a value in terms of polystyrene measured through gel filtration chromatography (GPC).

Examples of the polythiophene compound include poly(3-n-hexylthiophene), poly(3-n-octyloxythiophene), poly(9,9'-dioctyl-fluorene-co-bithiophene), poly(3,3'''-didodecylquarter thiophene), poly(3,6-dioctylthieno[3,2-b]thiophene), poly(2,5-bis(3-decylthiophen-2-yl)thieno[3,2-b]thiophene), poly(3,4-didecylthiophene-co-thieno[3,2-b]thiophene), poly(3,6-dioctylthieno[3,2-b]thiophene-co-thieno[3,2-b]thiophene), poly(3,6-dioctylthieno[3,2-b]thiophene-co-thiophene), and poly(3,6-dioctylthieno[3,2-b]thiophene-co-bithiophene).

Examples of the polyphenylene vinylene compound include poly[2-methoxy-5-(2-ethylhexyloxy)-1,4-phenylenevinylene], poly[2-methoxy-5-(3,7-dimethyloctyloxy)-1,4-phenylenevinylene], and poly[(2-methoxy-5-(2-ethylhexyloxy)-1,4-phenylenevinylene)-co-(4,4'-biphenylenevinylene)].

Examples of the polyfluorene compound include poly(9,9'-didodecylfluorenyl-2,7-diyl), poly[(9,9-dioctyl-2,7-divinylenefluorene)-alt-co-(9,10-anthracene)], poly[(9,9-dioctyl-2,7-divinylenefluorene)-alt-co-(4,4'-biphenylene)], poly[(9,9-dioctyl-2,7-divinylenefluorene)-alt-co-(2-methoxy-5-(2-ethylhexyloxy)-1,4-phenylene)], and poly[(9,9-dioctyl-2,7-diyl)-co-(1,4-(2,5-dihexyloxy)benzene)].

Examples of the polyphenylene compound include poly[2,5-dioctyloxy-1,4-phenylene] and poly[2,5-di(2-ethylhexyloxy-1,4-phenylene].

Examples of the polyarylamine compound include poly[(9,9-dioctylfluorenyl-2,7-diyl)-alt-co-(N,N'-diphenyl)-N,N'-di(p-hexylphenyl)-1,4-diaminobenzene], poly[(9,9-dioctylfluorenyl-2,7-diyl)-alt-co-(N,N'-bis(4-octyloxyphenyl)benzidine-N,N'-(1,4-diphenylene)], poly[(N,N'-bis(4-octyloxyphenyl)benzidine-N,N'-(1,4-diphenylene)], poly[(N,N'-bis(4-(2-ethylhexyloxy)phenyl)benzidine-N,N'-(1,4-diphenylene)], poly[phenylimino-1,4-phenylenevinylene-2,5-dioctyloxy-1,4-phenylenevinylene-1,4-phenylene], poly[p-tolylimino-1,4-phenylenevinylene-2,5-di(2-ethylhexyloxy)-1,4-phenylenevinylene-1,4-phenylene], and poly[4-(2-ethylhexyloxy)phenylimino-1,4-biphenylene].

Examples of the polythiadiazole compound include poly[(9,9-dioctylfluorenyl-2,7-diyl)-alt-co-(1,4-benzo(2,1',3)thiadiazole] and poly(3,4-didecylthiophene-co-(1,4-benzo(2,1',3)thiadiazole).

The polymer having a weight average molecular weight of 2,000 or more is suitably a polymer including a recurring unit represented by General Formula (1) or (2) below.

[Chem. 1]

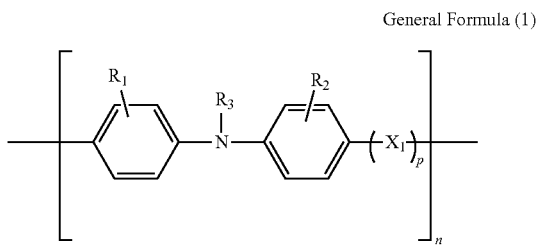

General Formula (1)

In the General Formula (1), $R_1$ and $R_2$, which may be identical to or different from each other, each represent at least one selected from the group consisting of a hydrogen atom, an alkyl group, an aralkyl group, an alkoxy group, and an aryl group.

Examples of the alkyl group include a methyl group, an ethyl group, and a 2-isobutyl group.

Examples of the aralkyl group include a benzyl group and a 2-naphthylmethyl group.

Examples of the alkoxy group include a methoxy group and an ethoxy group.

Examples of the aryl group include a phenyl group and a 1-naphthyl group.

$R_3$ represents one selected from the group consisting of an alkyl group, an aralkyl group, an aryl group, and a heterocyclic group.

Examples of the alkyl group include a methyl group, an ethyl group, and a 2-isobutyl group.

Examples of the aralkyl group include a benzyl group and a 2-naphthylmethyl group.

Examples of the aryl group include a phenyl group and a 1-naphthyl group.

Examples of the heterocyclic group include a thiophene ring group and a furan ring group.

$X_1$ represents one selected from the group consisting of an alkylene group, an alkenyl group, an alkynyl group, an aryl group, and a heterocyclic group.

Examples of the alkylene group include a methylene group, an ethylene group, a propylene group, a butylene group, and a hexylene group.

Examples of the alkenyl group include a vinyl group.

Examples of the alkynyl group include acetylene.

Examples of the aryl group include a phenyl group and a 1-naphthyl group.

Examples of the heterocyclic group include a thiophene ring group and a furan ring group.

n represents an integer that is 2 or more and allows the polymer including the recurring unit represented by the General Formula (1) to have a weight average molecular weight of 2,000 or more. p represents 0, 1, or 2.

[Chem. 2]

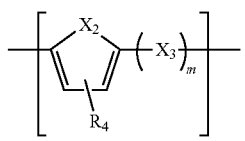

General Formula (1)

In the General Formula (2), $R_4$ represents one selected from the group consisting of a hydrogen atom, an alkyl group, an aralkyl group, an alkoxy group, and an aryl group.

Examples of the alkyl group include a methyl group, an ethyl group, and a 2-isobutyl group.

Examples of the aralkyl group include a benzyl group and a 2-naphthylmethyl group.

Examples of the alkoxy group include a methoxy group and an ethoxy group.

Examples of the alkenyl group include a vinyl group.

Examples of the aryl group include a phenyl group and a 1-naphthyl group.

$X_2$ represents one selected from the group consisting of an oxygen atom, a sulfur atom, and a selenium atom.

$X_3$ represents one selected from the group consisting of an alkenyl group, an alkynyl group, an aryl group, and a heterocyclic group.

Examples of the alkenyl group include a vinyl group.

Examples of the alkynyl group include acetylene.

Examples of the aryl group include a phenyl group and a 1-naphthyl group.

Examples of the heterocyclic group include a thiophene ring group and a furan ring group.

m represents an integer that is 2 or more and allows the polymer including the recurring unit represented by the General Formula (2) to have a weight average molecular weight of 2,000 or more. q represents 0, 1, or 2.

Examples of the polymer including the recurring unit represented by the General Formula (1) include the following (A-1) to (A-25). In the formula, n represents an integer that is 2 or more and allows the polymer including the recurring unit represented by the General Formula (1) to have a weight average molecular weight of 2,000 or more.

[Chem. 3]

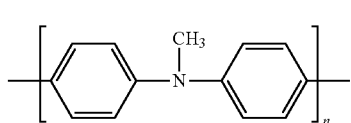

(A-1)

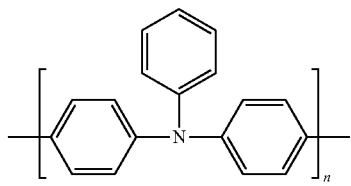

(A-2)

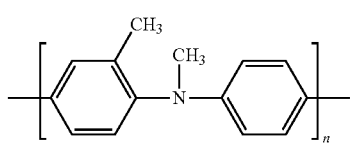

(A-3)

[Chem. 4]
(A-4)
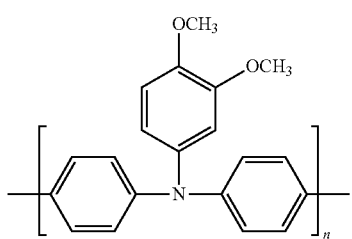
(A-5)
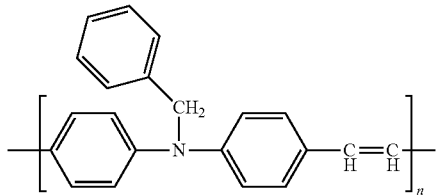
(A-6)
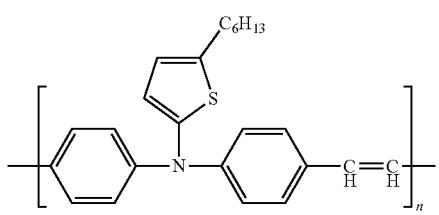
[Chem. 5]
(A-7)
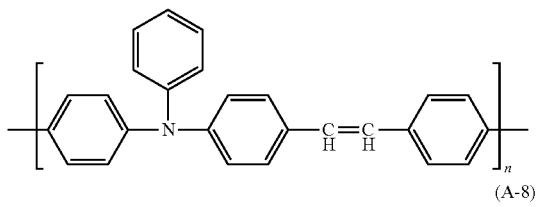
(A-8)
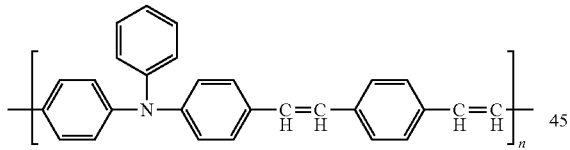
[Chem. 6]
(A-9)
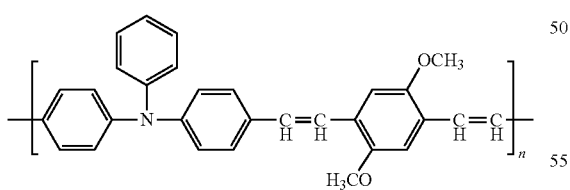
(A-10)
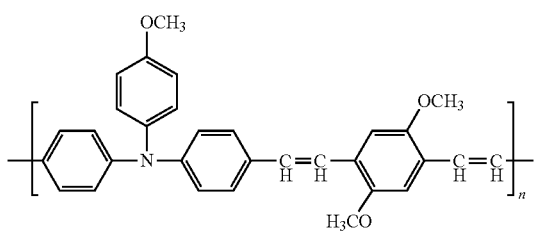
[Chem. 7]
(A-11)
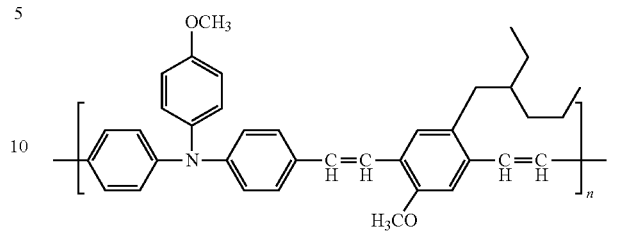
(A-12)
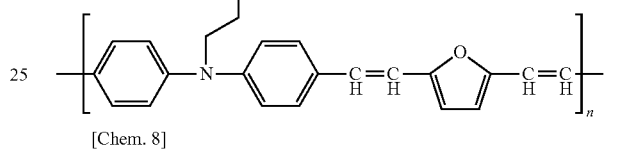
[Chem. 8]
(A-13)
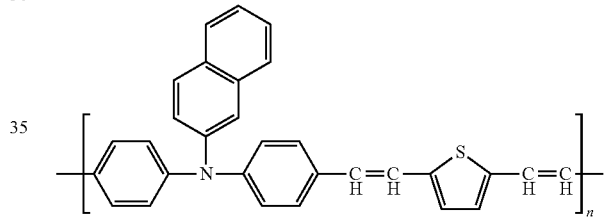
(A-14)
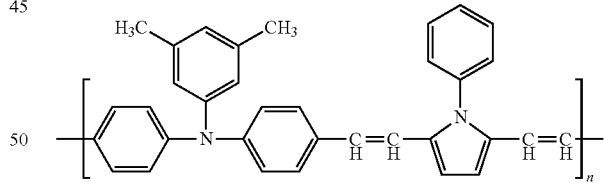
[Chem. 9]
(A-15)
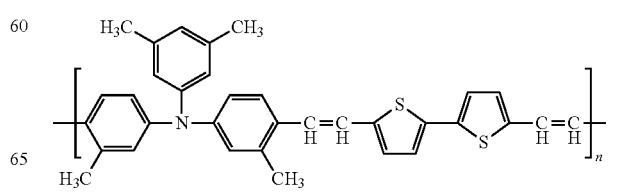

(A-16)
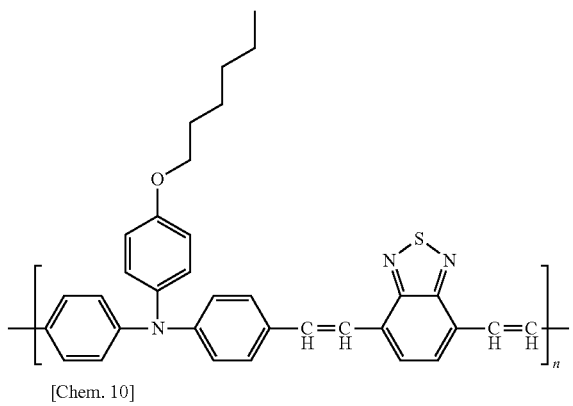
[Chem. 10]
(A-17)
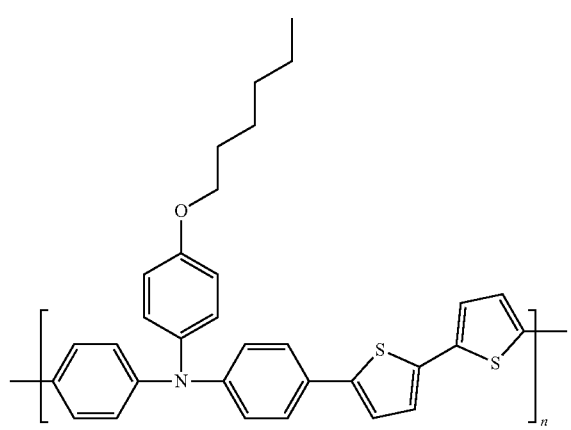
(A-18)
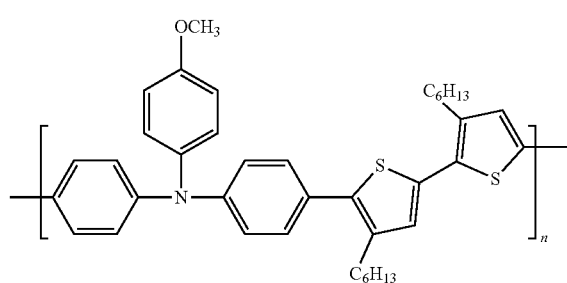
(A-19)
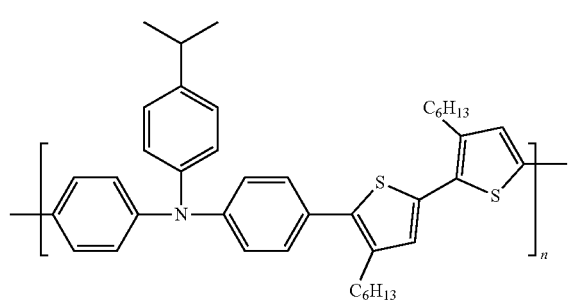
[Chem. 11]
(A-20)
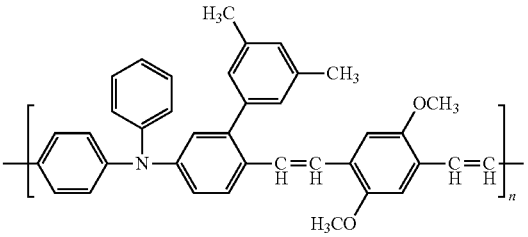
(A-21)
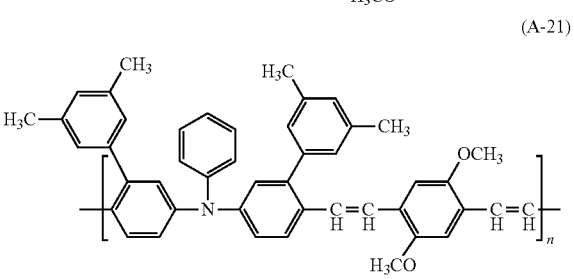
(A-22)
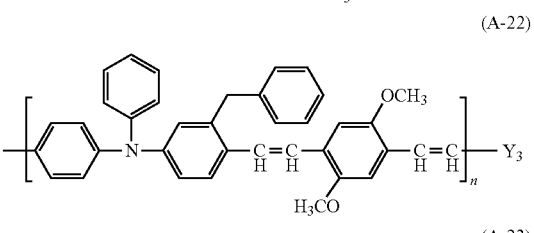
(A-23)
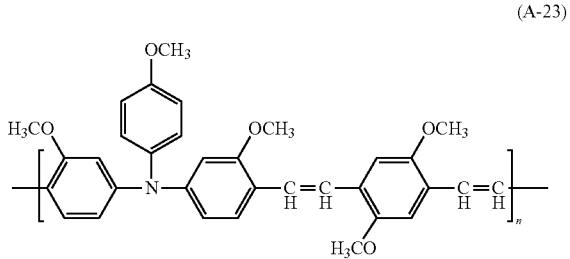
(A-24)
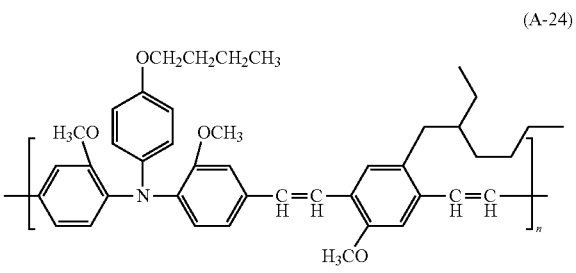
(A-25)
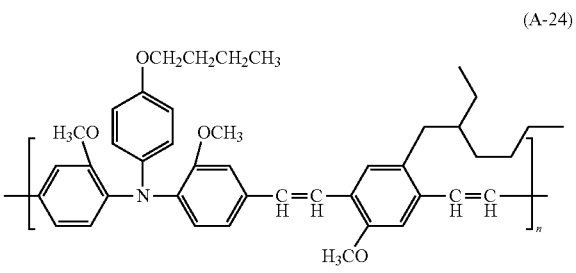
Examples of the polymer including the recurring unit represented by the General Formula (2) include the following (B-1) to (B-32). In the formula, m represents an integer that is 2 or more and allows the polymer represented by the General Formula (2) to have a weight average molecular weight of 2,000 or more.

[Chem. 12]
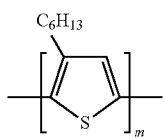
(B-1)
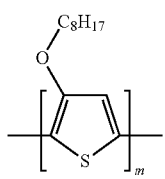
(B-2)
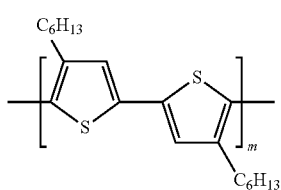
(B-3)
[Chem. 13]
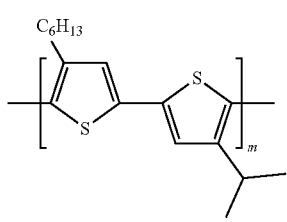
(B-4)
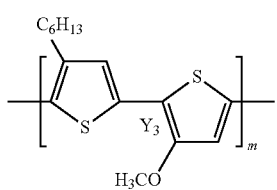
(B-5)
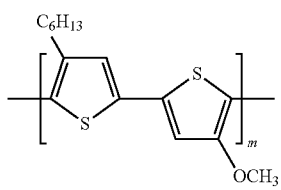
(B-6)
[Chem. 14]
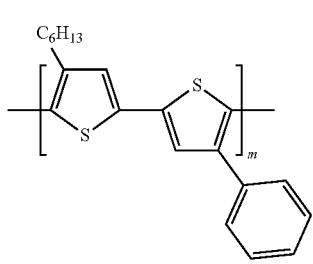
(B-7)
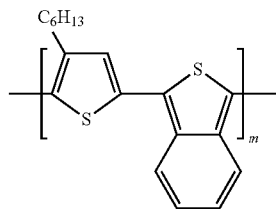
(B-8)
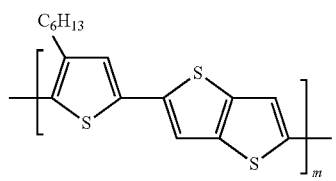
(B-9)
[Chem. 15]
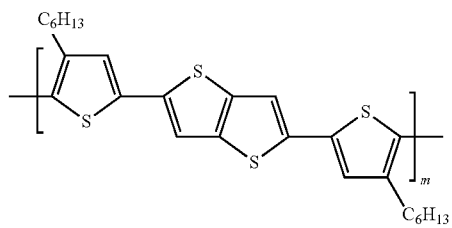
(B-10)
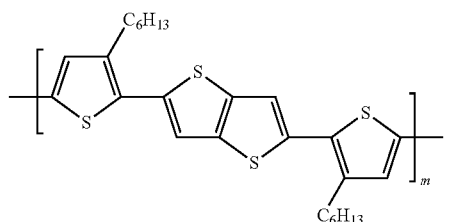
(B-11)
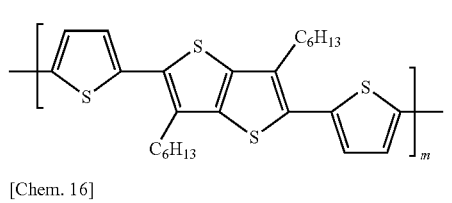
(B-12)
[Chem. 16]
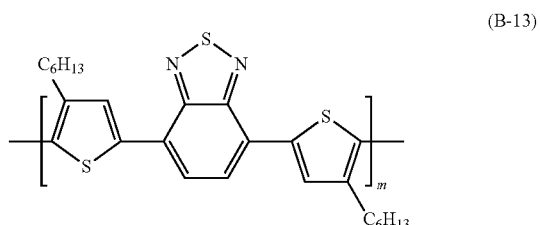
(B-13)
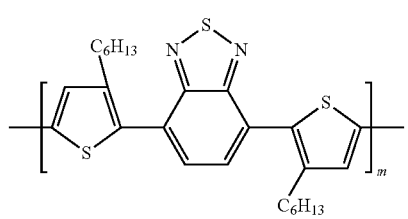
(B-14)

(B-15)
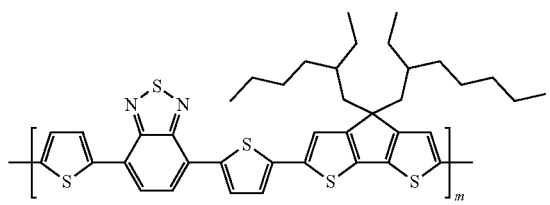
[Chem. 17]
(B-16)
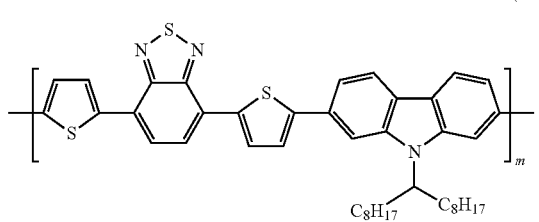
(B-17)
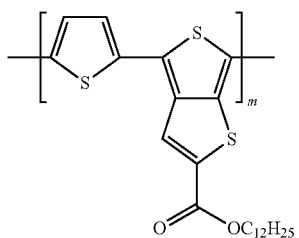
(B-18)
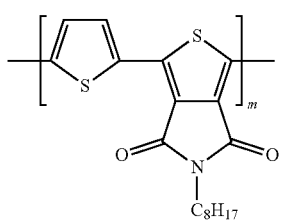
[Chem. 18]
(B-19)
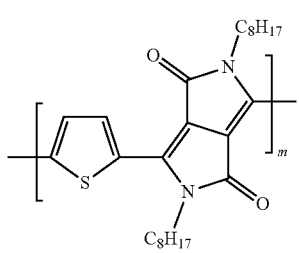
(B-20)
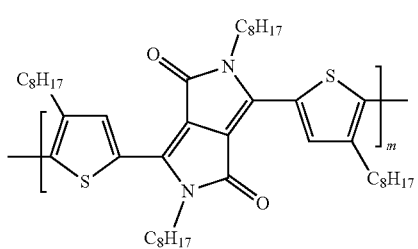
(B-21)
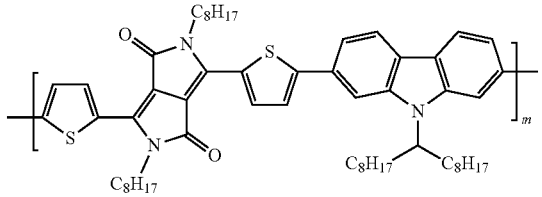
[Chem. 19]
(B-22)
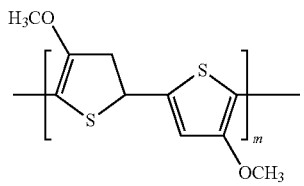
(B-23)
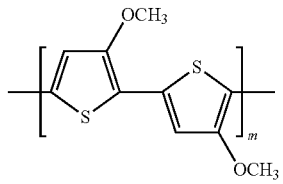
(B-24)
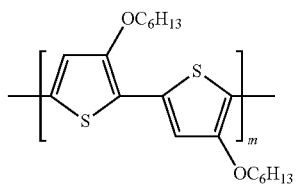
[Chem. 20]
(B-25)
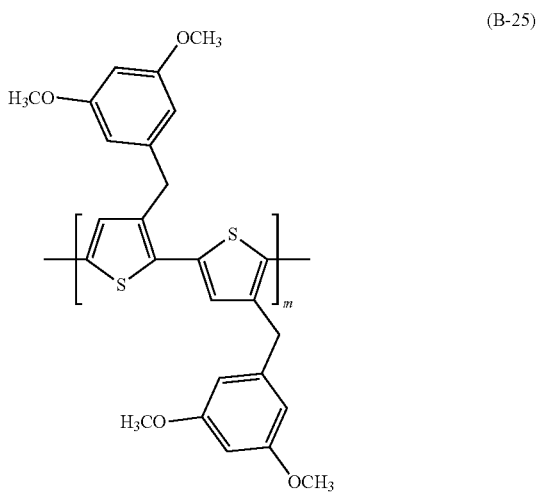

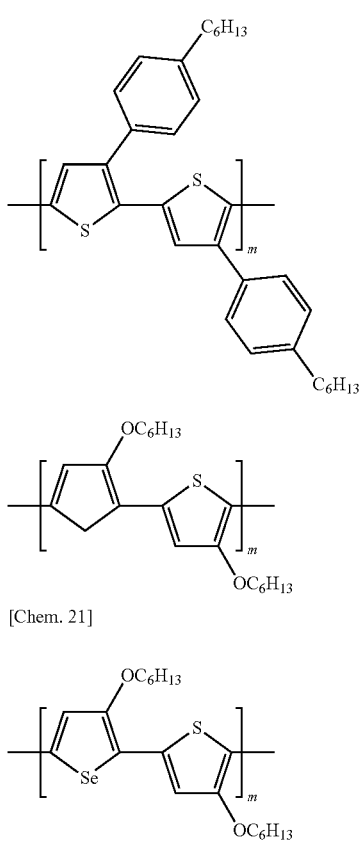
[Chem. 21]
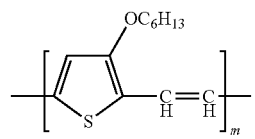
(B-29)
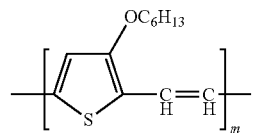
(B-30)
[Chem. 22]
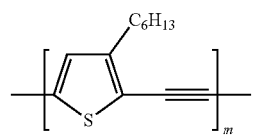
(B-31)
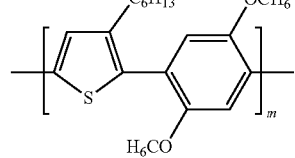
(B-32)
—Compound Having Molecular Weight of 2,000 or More—
Examples of the compound having a molecular weight of 2,000 or more include the following.

(C-3)
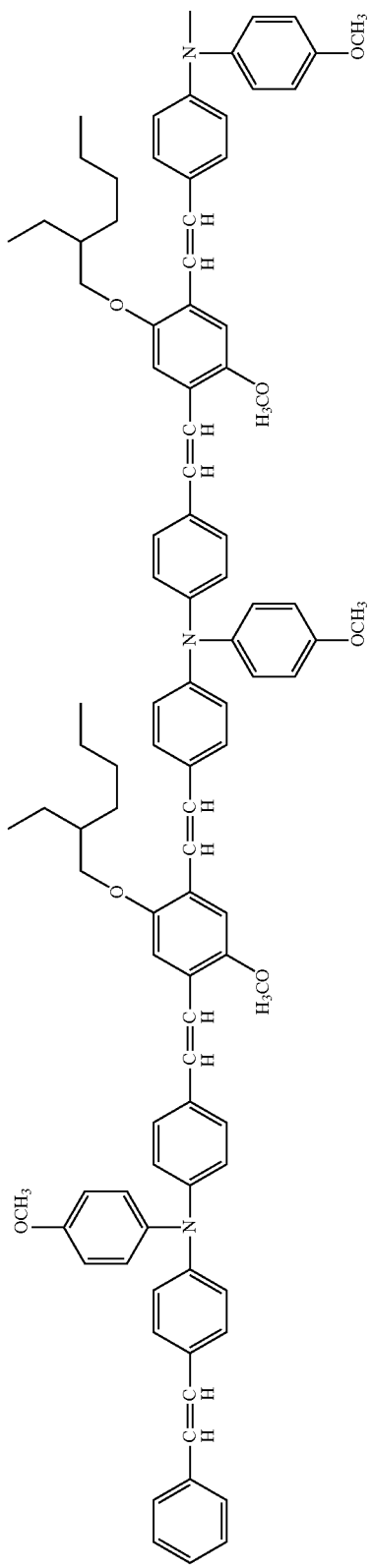
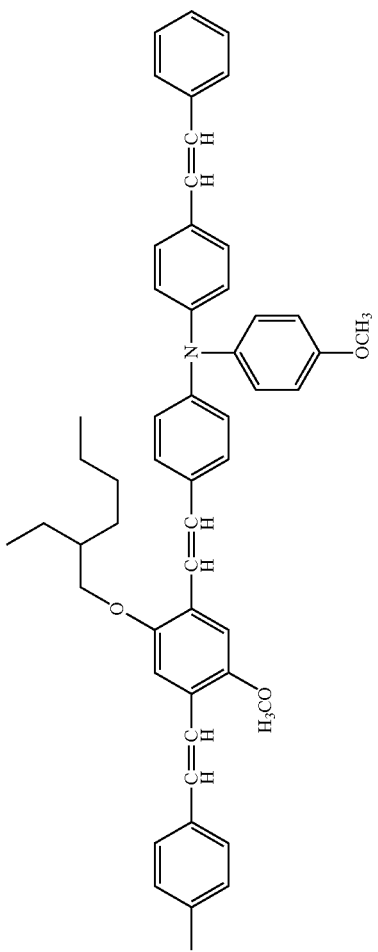
[Chem. 23]

—Compound Having Molecular Weight of Less than 2,000—

The compound having a molecular weight of less than 2,000 is a hole transport material, and a chemical structure thereof is not particularly limited. Specific examples of the compound having a molecular weight of less than 2,000 include: oxadiazole compounds described in, for example, Japanese Examined Patent Publication No. 34-5466; triphenylmethane compounds described in, for example, Japanese Examined Patent Publication No. 45-555; pyrazoline compounds described in, for example, Japanese Examined Patent Publication No. 52-4188; hydrazone compounds described in, for example, Japanese Examined Patent Publication No. 55-42380; oxadiazole compounds described in, for example, Japanese Unexamined Patent Application Publication No. 56-123544; tetraarylbenzidine compounds described in Japanese Unexamined Patent Application Publication No. 54-58445; stilbene compounds described in Japanese Unexamined Patent Application Publication No. 58-65440 and Japanese Unexamined Patent Application Publication No. 60-98437; spirobifluorene compounds described in Japanese Unexamined Patent Application Publication No. 2007-115665, Japanese Unexamined Patent Application Publication No. 2014-72327, Japanese Patent Application No. 2000-067544, WO2004/063283, WO2011/030450, WO2011/45321, WO2013/042699, and WO2013/121835; and thiophene compounds and triarylamine compounds described in Japanese Unexamined Patent Application Publication No. 2-250881, and Japanese Unexamined Patent Application Publication No. 2013-033868.

Among them, spirobifluorene compounds, triarylamine compounds, and thiophene compounds are preferable.

—Spirobifluorene Compound—

The spirobifluorene compound is not particularly limited and may be appropriately selected depending on the intended purpose. In terms of the power generation efficiency, examples of the spirobifluorene compound include: (2,2',7,7'-tetrakis(N,N-di-p-methoxyphenylamino)-9,9'-spirobifluorene: spiro-OMeTAD) as the hole transport material described in "J. Am. Chem. Soc., 133 (2011) 18042"; (N2',N2',N5,N5,N7',N7',N9,N9-octakis(4-methoxyphenyl)spiro[dibenzo-[c,h]xanthene-7,9'-fluorene]-2',5,7',9-tetraamine: X62) as the hole transport material described in "Chem. Commun., 54, (2018) 9571"; (N2,N7-bis(4-methoxyphenyl)-N2,N7-di(spiro[fluorene-9,9'-xanthen]-2-yl)spiro[fluorene-9,9'-xanthene]-2,7-diamine: X55) as the hole transport material described in "Chem, 2 (2017) 676"; (N2,N2,N7,N7-tetrakis(4-methoxyphenyl)spiro[fluorene-9,9'-xanthene]-2,7-diamine: X59) as the hole transport material described in "Nano Energy, 23 (2016) 138"; and (octakis(4-methoxyphenyl)spiro[fluorene-9,9'-xanthene]-2,2',7,7'-tetraamine): X60) as the hole transport material described in "Energy & Environmental Science, 9 (2016) 873". Among them, spiro-OMeTAD is preferable. The spiro-OMeTAD is expressed by the following Structural Formula (1).

[Chem. 23]

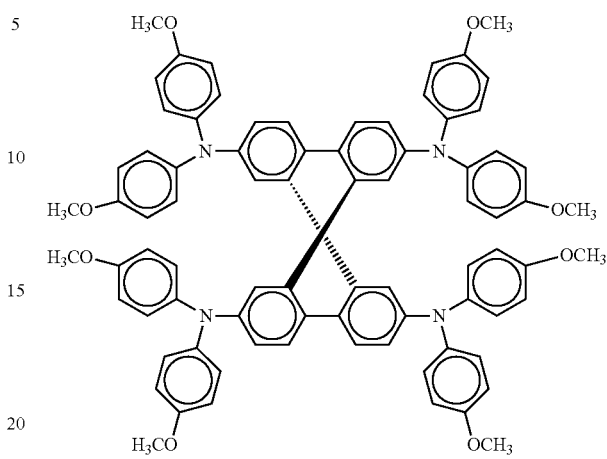

<Structural Formula (1)>

—Triarylamine Compound—

Examples of the triarylamine compound include compounds represented by the following General Formula 3.

$$A_n\text{-}B_m \quad \text{(General Formula 3)}$$

When n is 2, m is 0, and when n is 1, m is 0 or 1. A is a structure represented by the following General Formula 4 and is bound to B at a position selected from the group consisting of $Z_1$ to $Z_{15}$. B is a structure represented by the following General Formula 5, and is bound to A at a position selected from the group consisting of $Z_{16}$ to $Z_{21}$.

[Chem. 24]

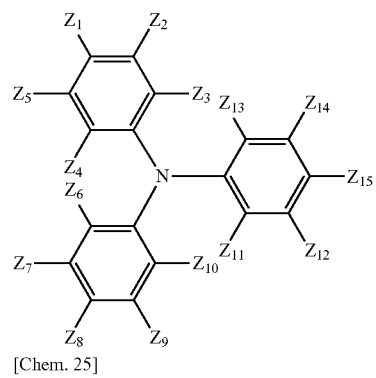

(General Formula 4)

[Chem. 25]

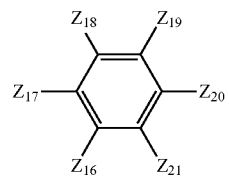

(General Formula 5)

$Z_1$ to $Z_{21}$, which may be identical to or different from each other, each represent a monovalent organic group.

Examples of each of the monovalent organic groups in the General Formula 4 and the General Formula 5 include a hydrogen atom, a halogen atom, a hydroxyl group, a nitro group, a cyano group, a carboxyl group, an alkoxycarbonyl group that may have a substituent, an aryloxycarbonyl group that may have a substituent, an alkylcarbonyl group that may have a substituent, an arylcarbonyl group that may have a substituent, an amide group, a monoalkylaminocarbonyl group that may have a substituent, a dialkylaminocarbonyl group that may have a substituent, a monoarylaminocarbonyl group that may have a substituent, a diarylaminocarbonyl group that may have a substituent, a sulfonate group, an alkoxysulfonyl group that may have a substituent, an aryloxysulfonyl group that may have a substituent, an alkylsulfonyl group that may have a substituent, an arylsulfonyl group that may have a substituent, a sulfonamide group, a monoalkylamino sulfonyl group that may have a substituent, a dialkylamino sulfonyl group that may have a substituent, a monoarylaminosulfonyl group that may have a substituent, a diarylaminosulfonyl group that may have a substituent, an amino group, a monoalkylamino group that may have a substituent, a dialkylamino group that may have a substituent, an alkyl group that may have a substituent, an alkenyl group that may have a substituent, an alkynyl group that may have a substituent, an aryl group that may have a substituent, an alkoxy group that may have a substituent, an aryloxy group that may have a substituent, an alkylthio group that may have a substituent, an arylthio group that may have a substituent, and a heterocyclic group that may have a substituent.

Among them, an alkyl group, an alkoxy group, a hydrogen atom, an aryl group, an aryloxy group, a halogen atom, an alkenyl group, and an alkynyl group are particularly preferable in terms of stable behavior.

Examples of the halogen atom include a fluorine atom, a chlorine atom, a bromine atom, and an iodine atom.

Examples of the alkyl group include a methyl group, an ethyl group, a propyl group, and a butyl group.

Examples of the aryl group include a phenyl group and a naphthyl group.

Examples of the aralkyl group include a benzyl group, a phenethyl group, and a naphthylmethyl group.

Examples of the alkoxy group include a methoxy group, an ethoxy group, and a propoxy group.

Examples of the aryloxy group include a phenoxy group, a 1-naphthyloxy group, a 2-naphthyloxy group, a 4-methoxyphenoxy group, and a 4-methylphenoxy group.

Examples of the heterocyclic group include carbazole, dibenzofuran, dibenzothiophene, oxadiazole, and thiadiazole.

Examples of the substituent that is further substituted with a substituent include: alkyl groups such as a halogen atom, a nitro group, a cyano group, a methyl group, and an ethyl group; alkoxy groups such as a methoxy group and an ethoxy group; aryloxy groups such as a phenoxy group; aryl groups such as a phenyl group and a naphthyl group; and aralkyl groups such as a benzyl group and a phenethyl group.

Specific examples of the triarylamine compound include the compound (C-1) expressed by the following Structural Formula.

[Chem. 26]

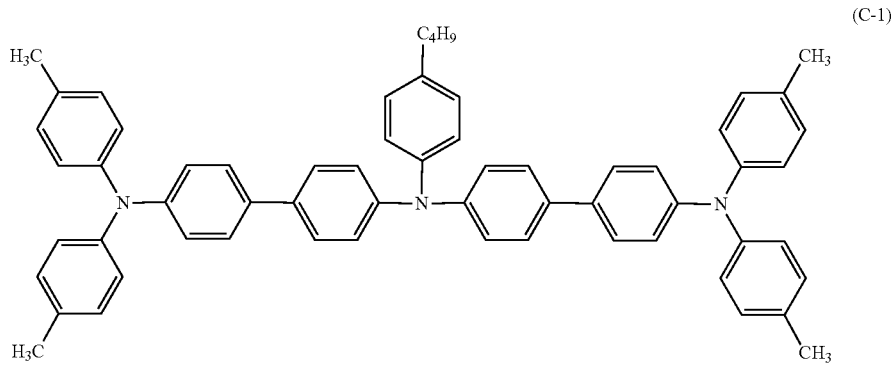

(C-1)

—Thiophene Compound—

The thiophene compound is not particularly limited and may be appropriately selected depending on the intended purpose. Examples of the thiophene compound include thiophene, benzothiophene, azadibenzothiophene, and the compound (C-2) expressed by the following Structural Formula.

[Chem. 27]
(C-2) (C-3)
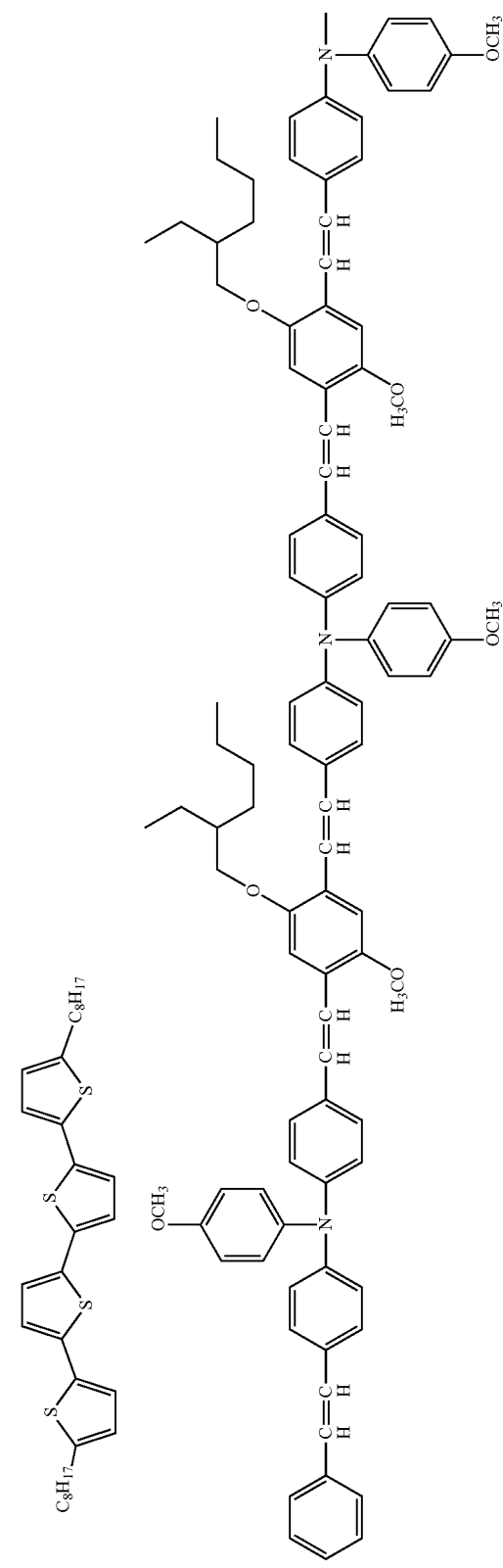
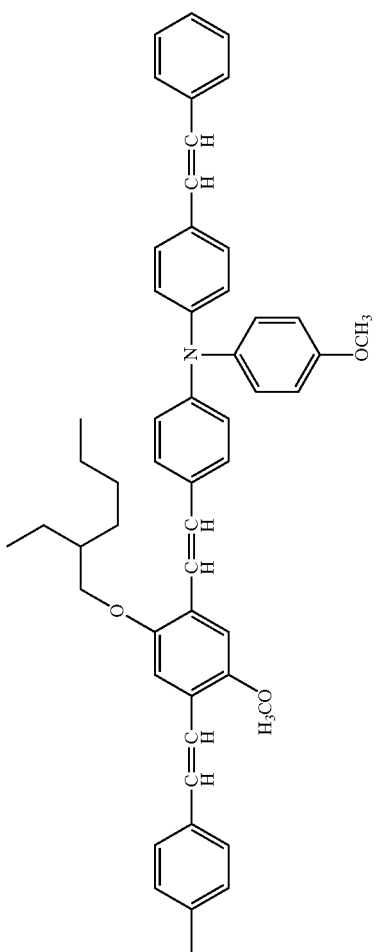

In the present disclosure, when a polymer having a weight average molecular weight of 2,000 or more and a compound having a molecular weight of less than 2,000 are mixed, a difference between the respective ionization potentials is preferably 0.2 eV or less. The ionization potential is energy necessary for extracting one electron from a molecule, and is represented by a unit of electron volt (eV). A method for measuring the ionization potential is not particularly limited. However, the ionization potential is preferably measured through photoelectron spectroscopy.

When the ionization potential of the polymer having a weight average molecular weight of 2,000 or more is IPa and the ionization potential of the compound having a molecular weight of less than 2,000 is IPb, it is preferable to satisfy the following: IPa−IPb=±0.2 eV or less. When the difference is 0.2 eV or more, holes remain trapped in one side to be hardly moved. As a result, holes cannot be smoothly transported.

A mixing ratio between the polymer having a weight average molecular weight of 2,000 or more and the compound having a molecular weight of less than 2,000 is preferably from 4:6 through 9:1, more preferably from 4:6 through 7:3, still more preferably from 1:1 through 7:3, by mass ratio.

Other materials included in the hole transport layer are not particularly limited and may be appropriately selected depending on the intended purpose. Examples of the other materials include additives and oxidizing agents.

The additive is not particularly limited and may be appropriately selected depending on the intended purpose. Examples of the additive include: iodine; metal iodides such as lithium iodide, sodium iodide, potassium iodide, cesium iodide, calcium iodide, copper iodide, iron iodide, and silver iodide; quaternary ammonium salts such as tetraalkylammonium iodide and pyridinium iodide; metal bromides such as lithium bromide, sodium bromide, potassium bromide, cesium bromide, and calcium bromide; bromine salts of quaternary ammonium compounds such as tetraalkylammonium bromide and pyridinium bromide; metal chlorides such as copper chloride and silver chloride; metal acetates such as copper acetate, silver acetate, and palladium acetate; metal sulfates such as copper sulfate and zinc sulfate; metal complexes such as ferrocyanate-ferricyanate and ferrocene-ferricinium ion; sulfur compounds such as sodium polysulfide and alkylthiol-alkyl disulfide; viologen dyes; hydroquinones; and basic compounds such as pyridine, 4-t-butylpyridine, and benzimidazole.

An oxidizing agent can further be added. A kind of oxidizing agent is not particularly limited and may be appropriately selected depending on the intended purpose. Examples of the oxidizing agent include tris(4-bromophenyl) aminium hexachloroantimonate, silver hexafluoroantimonate, nitrosonium tetrafluoroborate, silver nitrate, and cobalt complex. Note that, it is not necessary to oxidize the entire hole transport material with the oxidizing agent, and it is effective so long as the hole transport material is partially oxidized. After the reaction, the oxidizing agent may be removed or may not be removed outside the system. Inclusion of the oxidizing agent in the hole transport layer can partially or entirely form the hole transport material into radical cations, which makes it possible to improve conductivity and to increase safety and durability of output characteristics.

An average thickness of the hole transport layer is not particularly limited and may be appropriately selected depending on the intended purpose. However, the average thickness thereof is preferably 0.01 m or more but 20 m or less, more preferably 0.1 m or more but 10 m or less, still more preferably 0.2 m or more but 2 m or less, on the perovskite layer.

The hole transport layer can be directly formed on the perovskite layer. A method for producing the hole transport layer is not particularly limited and may be appropriately selected depending on the intended purpose. Examples of the method include: a method in which a thin film is formed in vacuum through vacuum deposition; and a wet film forming method. In particular, among them, a wet film forming method is preferable, a method in which the hole transport layer is coated on the perovskite layer is more preferable, in terms of production cost. The wet film forming method is not particularly limited and may be appropriately selected depending on the intended purpose. Examples of the wet film forming method include a dip method, a spraying method, a wire bar method, a spin coating method, a roller coating method, a blade coating method, and a gravure coating method. As the wet printing method, methods such as relief printing, offset printing, gravure printing, intaglio printing, rubber plate printing, and screen printing may be used.

Moreover, the hole transport layer may be produced by forming a film in a supercritical fluid or subcritical fluid having a lower temperature and pressure than a critical point.

The supercritical fluid means a fluid, which exists as a non-condensable high-density fluid in a temperature and pressure region exceeding the limit (critical point) at which a gas and a liquid can coexist and does not condense even when being compressed, and is a fluid in a state of being equal to or higher than the critical temperature and is equal to or higher than the critical pressure. The supercritical fluid is not particularly limited and may be appropriately selected depending on the intended purpose, but is preferably a supercritical fluid having a low critical temperature. The subcritical fluid is not particularly limited and may be appropriately selected depending on the intended purpose, so long as it is a fluid that exists as a high-pressure liquid in a temperature and pressure region near the critical point. The fluids as exemplified as the supercritical fluid can be suitably used as the subcritical fluid.

Examples of the supercritical fluid include carbon monoxide, carbon dioxide, ammonia, nitrogen, water, alcohol solvents, hydrocarbon solvents, halogen solvents, and ether solvents.

Examples of the alcohol solvent include methanol, ethanol, and n-butanol.

Examples of the hydrocarbon solvent include ethane, propane, 2,3-dimethylbutane, benzene, and toluene. Examples of the halogen solvent include methylene chloride and chlorotrifluoromethane.

Examples of the ether solvent include dimethyl ether.

These may be used alone or in combination.

Among them, carbon dioxide, which has a critical pressure of 7.3 MPa and a critical temperature of 31 degrees Celsius, is preferable because carbon dioxide easily generates a supercritical state, and it is incombustible and is easily handled.

A critical temperature and a critical pressure of the supercritical fluid are not particularly limited and may be appropriately selected depending on the intended purpose. The critical temperature of the supercritical fluid is preferably −273 degrees Celsius or more but 300 degrees Celsius or less, more preferably 0 degrees Celsius or more but 200 degrees Celsius or less.

In addition to the supercritical fluid and the subcritical fluid, an organic solvent or an entrainer may be used in combination. Adjustment of solubility in the supercritical fluid can be easily performed by adding the organic solvent or the entrainer.

The organic solvent is not particularly limited and may be appropriately selected depending on the intended purpose. Examples of the organic solvent include ketone solvents, ester solvents, ether solvents, amide solvents, halogenated hydrocarbon solvents, and hydrocarbon solvents. Examples of the ketone solvent include acetone, methyl ethyl ketone, and methyl isobutyl ketone.

Examples of the ester solvent include ethyl formate, ethyl acetate, and n-butyl acetate.

Examples of the ether solvent include diisopropyl ether, dimethoxy ethane, tetrahydrofuran, dioxolane, and dioxane. Examples of the amide solvent include N,N-dimethylformamide, N,N-dimethylacetoamide, and N-methyl-2-pyrrolidone.

Examples of the halogenated hydrocarbon solvent include dichloromethane, chloroform, bromoform, methyl iodide, dichloroethane, trichloroethane, trichloroethylene, chlorobenzene, o-dichlorobenzene, fluorobenzene, bromobenzene, iodobenzene, and 1-chloronaphthalene.

Examples of the hydrocarbon solvent include n-pentane, n-hexane, n-octane, 1,5-hexadiene, cyclohexane, methylcyclohexane, cyclohexadiene, benzene, toluene, o-xylene, m-xylene, p-xylene, ethylbenzene, and cumene.

These may be used alone or in combination.

After the hole transport material is laminated on the perovskite layer, a press processing step may be performed. By performing the press processing, the hole transport material is more closely adhered to the perovskite layer, which may improve the power generation efficiency in some cases.

A method of the press processing is not particularly limited and may be appropriately selected depending on the intended purpose. Examples of the method include: the press molding method using a plate, which is represented by the infrared spectroscopy (IR) tablet molding device; and the roll press method using a roller.

A pressure at which the press processing is performed is preferably 10 kgf/cm$^2$ or more, more preferably 30 kgf/cm$^2$ or more.

The time of the pressing is not particularly limited and may be appropriately selected depending on the intended purpose. The time thereof is preferably 1 hour or less. Moreover, heat may be applied at the time of the pressing.

At the time of the pressing, a release agent may be disposed between a pressing machine and the electrode.

The release agent is not particularly limited and may be appropriately selected depending on the intended purpose. Examples of the release agent include fluororesins, such as polyethylene tetrafluoride, polychloro ethylene trifluoride, ethylene tetrafluoride-propylene hexafluoride copolymers, perfluoroalkoxy fluoride resins, polyvinylidene fluoride, ethylene-ethylene tetrafluoride copolymers, ethylene-chloroethylene trifluoride copolymers, and polyvinyl fluoride. These may be used alone or in combination.

After performing the pressing but before disposing a second electrode, a film including metal oxide may be disposed between the hole transport layer and the second electrode.

The metal oxide is not particularly limited and may be appropriately selected depending on the intended purpose. Examples of the metal oxide include molybdenum oxide, tungsten oxide, vanadium oxide, and nickel oxide. These may be used alone or in combination. Among them, molybdenum oxide is preferable.

A method for disposing the film including metal oxide on the hole transport layer is not particularly limited and may be appropriately selected depending on the intended purpose. Examples of the method include: a method in which a thin film is formed in vacuum such as sputtering and vacuum vapor deposition; and a wet film forming method.

The wet film forming method in the case where the film including metal oxide is formed is preferably a method in which a paste dispersing powders or sol of the metal oxide is prepared, followed by coating it on the hole transport layer.

The wet film forming method is not particularly limited and may be appropriately selected depending on the intended purpose. Examples of the wet film forming method include a dip method, a spraying method, a wire bar method, a spin coating method, a roller coating method, a blade coating method, and a gravure coating method. As the wet printing method, methods such as relief printing, offset printing, gravure printing, intaglio printing, rubber plate printing, and screen printing may be used.

An average thickness of the film including metal oxide is not particularly limited and may be appropriately selected depending on the intended purpose. However, the average thickness thereof is preferably 0.1 nm or more but 50 nm or less, more preferably 1 nm or more but 10 nm or less.

<<Second Electrode>>

The second electrode is preferably formed on the hole transport layer or a film of the metal oxide in the hole transport layer. The same as the first electrode can be used for the second electrode. A shape, a structure, and a size of the second electrode are not particularly limited and may be appropriately selected depending on the intended purpose. Examples of a material of the second electrode include metals, carbon compounds, conductive metal oxides, and conductive polymers.

Examples of the metal include platinum, gold, silver, copper, and aluminum.

Examples of the carbon compound include graphite, fullerene, carbon nanotube, and graphene.

Examples of the conductive metal oxide include ITO, FTO, and ATO.

Examples of the conductive polymer include polythiophene and polyaniline.

These may be used alone or in combination.

The second electrode can be appropriately formed on the hole transport layer through a method such as coating, laminating, vacuum deposition, CVD, or bonding, depending on a kind of the material to be used or a kind of the hole transport layer.

In the photoelectric conversion element, at least one of the first electrode and the second electrode is preferably substantially transparent. When the solar cell module of the present disclosure is used, the first electrode is preferably transparent to allow entrance of incident light from a side of the first electrode. In this case, a material that reflects light is preferably used for the second electrode, and glass, plastic, and a metal thin film on which a metal or conductive oxide is deposited are preferably used. In addition, provision of an anti-reflection layer at a side of the electrode into which the incident light enters is an effective means.

<Second Substrate>

The second substrate is disposed so as to face the first substrate, so that the first substrate and the second substrate sandwich the photoelectric conversion elements.

A shape, a structure, and a size of the substrate are not particularly limited and may be appropriately selected depending on the intended purpose.

A material of the second substrate is not particularly limited and may be appropriately selected depending on the intended purpose. Examples of the material include glass, plastic films, and ceramics.

A convex-concave part may be formed at a connection part of the second substrate with a sealing member, which will be described hereinafter, in order to increase adhesiveness. A formation method of the convex-concave part is not particularly limited and may be appropriately selected depending on the intended purpose. Examples of the formation method include a sand blasting method, a water blasting method, a chemical etching method, a laser processing method, and a method using abrasive paper.

A method for increasing adhesiveness between the second substrate and the sealing member may be, for example, a method for removing an organic matter on the surface of the second substrate, or a method for improving hydrophilicity of the second substrate. The method for removing an organic matter on the surface of the second substrate is not particularly limited and may be appropriately selected depending on the intended purpose. Examples of the method include UV ozone washing and an oxygen plasma treatment.

<Sealing Member>

The sealing member is disposed between the first substrate and the second substrate, and seals the photoelectric conversion elements.

A material of the sealing member is not particularly limited and may be appropriately selected depending on the intended purpose. Examples of the material include cured products of acrylic resins and cured products of epoxy resins.

As the cured product of the acrylic resin, any of materials known in the art can be used, so long as the cured product of the acrylic resin is a product obtained by curing a monomer or oligomer including an acryl group in a molecule thereof.

As the cured product of the epoxy resin, any of materials known in the art can be used, so long as the cured product of the epoxy resin is a product obtained by curing a monomer or oligomer including an epoxy group in a molecule thereof.

Examples of the epoxy resin include water-dispersing epoxy resins, non-solvent epoxy resins, solid epoxy resins, thermosetting epoxy resins, curing agent-mixed epoxy resins, and ultraviolet ray-curable epoxy resins. Among them, thermosetting epoxy resins and ultraviolet ray-curable epoxy resins are preferable, ultraviolet ray-curable epoxy resins are more preferable. Note that, heating may be performed even when an ultraviolet ray-curable epoxy resin is used, and heating is preferably performed even after curing through ultraviolet ray irradiation.

Examples of the epoxy resin include bisphenol A-based epoxy resins, bisphenol F-based epoxy resins, novolac-based epoxy resins, alicyclic epoxy resins, long-chain aliphatic epoxy resins, glycidyl amine-based epoxy resins, glycidyl ether-based epoxy resins, and glycidyl ester-based epoxy resins. These may be used alone or in combination.

A curing agent or various additives are preferably mixed with the epoxy resin if necessary.

The curing agent is not particularly limited and may be appropriately selected depending on the intended purpose. The curing agents are classified into, for example, amine-based curing agents, acid anhydride-based curing agents, polyamide-based curing agents, and other curing agents.

Examples of the amine-based curing agent include: aliphatic polyamines such as diethylenetriamine and triethylenetetramine; and aromatic polyamines such as methphenylenediamine, diaminodiphenylmethane, and diaminodiphenylsulfone.

Examples of the acid anhydride-based curing agent include phthalic anhydride, tetrahydrophthalic anhydride, hexahydrophthalic anhydride, methyltetrahydrophthalic anhydride, methylnadic anhydride, pyromellitic anhydride, HET anhydride, and dodecenylsuccinic anhydride.

Examples of other curing agents include imidazoles and polymercaptan. These may be used alone or in combination.

The additive is not particularly limited and may be appropriately selected depending on the intended purpose. Examples of the additive include fillers, gap agents, polymerization initiators, drying agents (moisture absorbents), curing accelerators, coupling agents, flexibilizers, colorants, flame retardant auxiliaries, antioxidants, and organic solvents. Among them, fillers, gap agents, curing accelerators, polymerization initiators, and drying agents (moisture absorbents) are preferable, fillers and polymerization initiators are more preferable.

Inclusion of the filler as the additive prevents entry of moisture or oxygen, and further can achieve effects such as reduction in volumetric shrinkage at the time of curing, reduction in an amount of outgas at the time of curing or heating, improvement of mechanical strength, and control of thermal conductivity or fluidity. Therefore, inclusion of the filler as the additive is considerably effective in maintaining stable output under various environments.

In addition, regarding output properties or durability of a photoelectric conversion element, not only influence of passing moisture or oxygen, but also influence of outgas generated at the time of curing or heating the sealing member cannot be ignored. Particularly, the influence of outgas generated at the time of heating greatly affects output properties of the photoelectric conversion element stored under a high temperature environment.

Entry of moisture or oxygen can be prevented by adding filler, a gap agent, or a drying agent to the sealing member, and therefore an amount of the sealing member to be used can be reduced to thereby obtain an effect of reducing outgas. Inclusion of the filler, the gap agent, or the drying agent in the sealing member is effective not only at the time of curing but also at the time when the photoelectric conversion element is stored under a high temperature environment.

The filler is not particularly limited and may be appropriately selected depending on the intended purpose. Examples of the filler include inorganic fillers such as crystalline or amorphous silica, talc, alumina, aluminum nitride, silicon nitride, calcium silicate, and calcium carbonate. These may be used alone or in combination.

An average primary particle diameter of the filler is preferably 0.1 m or more but 10 m or less, more preferably 1 m or more but 5 m or less. When the average primary particle diameter of the filler falls within the above preferable range, an effect of preventing entry of moisture or oxygen can be sufficiently obtained, the viscosity becomes appropriate, and adhesiveness to a substrate or a defoaming property is improved. In addition, it is also effective in terms of control of a width of the sealing part or workability.

An amount of the filler is preferably 10 parts by mass or more but 90 parts by mass or less, more preferably 20 parts by mass or more but 70 parts by mass or less, relative to the total amount of the sealing member (100 parts by mass). When the amount of the filler falls within the above preferable range, an effect of preventing entry of moisture or oxygen can be sufficiently obtained, the viscosity becomes appropriate, and adhesiveness and workability is good.

The gap agent is also called a gap controlling agent or a spacer agent. By including the gap agent as the additive, it is possible to control the gap of the sealing part. For example, when a sealing member is provided on a first substrate or a first electrode and a second substrate is provided thereon for sealing, a gap of the sealing part is matched with a size of the gap agent because the sealing member includes the gap agent. As a result, it is possible to easily control the gap of the sealing part.

The gap agent is not particularly limited and may be appropriately selected depending on the intended purpose, so long as it is particulate, has a uniform diameter, and has high solvent resistance and heat resistance. The gap agent is preferably a material which has high affinity to an epoxy resin and is in the form of sphere particles. Preferable examples of the gap agent include glass beads, silica fine particles, and organic resin fine particles. These may be used alone or in combination.

A particle diameter of the gap agent can be selected depending on a gap of the sealing part to be set. The particle diameter thereof is preferably 1 m or more but 100 m or less, more preferably 5 m or more but 50 m or less.

The polymerization initiator is not particularly limited and may be appropriately selected depending on the intended purpose, so long as polymerization is initiated through heat and light. Examples of the polymerization initiator include thermal polymerization initiators and photopolymerization initiators.

The thermal polymerization initiator is a compound that generates active species such as radicals and cations upon heating. Examples of the thermal polymerization initiator include azo compounds such as 2,2'-azobisbutyronitrile (AIBN) and peroxides such as benzoyl peroxide (BPO). Examples of the thermal cationic polymerization initiator include benzenesulfonic acid ester and alkyl sulfonium salt. Meanwhile, as the photopolymerization initiator, a photocationic polymerization initiator is preferably used in the case of the epoxy resin. When the photocationic polymerization initiator is mixed with the epoxy resin and light is emitted, the photocationic polymerization initiator is decomposed to generate an acid, and the acid induces polymerization of the epoxy resin. Then, curing reaction proceeds. The photocationic polymerization initiator has such effects that less volumetric shrinkage during curing is caused, oxygen inhibition does not occur, and storage stability is high.

Examples of the photocationic polymerization initiator include aromatic diazonium salts, aromatic iodonium salts, aromatic sulfonium salts, metallocene compounds, and silanol-aluminum complexes.

Moreover, a photoacid generator having a function of generating an acid upon irradiation of light can be also used as the polymerization initiator. The photoacid generator functions as an acid for initiating cationic polymerization. Examples of the photoacid generator include onium salts such as ionic sulfonium salt-based onium salts and ionic iodonium salt-based onium salts including a cation part and an ionic part. These may be used alone or in combination.

An amount of the polymerization initiator added may be different depending on a material to be used. The amount of the polymerization initiator is preferably 0.5 parts by mass or more but 10 parts by mass or less, more preferably 1 part by mass or more but 5 parts by mass or less, relative to the total amount of the sealing member (100 parts by mass). When the amount of the polymerization initiator added falls within the aforementioned preferable range, curing appropriately proceeds, remaining uncured products can be decreased, and excessive outgassing can be prevented.

The drying agent is also called a moisture absorbent and is a material having a function of physically or chemically adsorbing or absorbing moisture. When the sealing member includes the drying agent, it is possible to further improve moisture resistance and to decrease influence of outgas.

The drying agent is not particularly limited and may be appropriately selected depending on the intended purpose, but is preferably a particulate material. Examples of the drying agent include inorganic water-absorbing materials such as calcium oxide, barium oxide, magnesium oxide, magnesium sulfate, sodium sulfate, calcium chloride, silica gel, molecular sieve, and zeolite. Among them, zeolite is preferable because zeolite absorbs a large amount of moisture. These may be used alone or in combination.

The curing accelerator is also called a curing catalyst and is a material that accelerates curing speed. The curing accelerator is mainly used for a heat curable epoxy resin.

The curing accelerator is not particularly limited and may be appropriately selected depending on the intended purpose. Examples of the curing accelerator include: tertiary amine or tertiary amine salts such as DBU (1,8-diazabicyclo(5,4,0)-undecene-7) and DBN (1,5-diazabicyclo(4,3,0)-nonene-5); imidazole-based compounds such as 1-cyanoethyl-2-ethyl-4-methylimidazole and 2-ethyl-4-methylimidazole; and phosphine or phosphonium salts such as triphenylphosphine and tetraphenylphosphonium·tetraphenyl borate. These may be used alone or in combination.

The coupling agent is not particularly limited and may be appropriately selected depending on the intended purpose, so long as it is a material having an effect of increasing molecular binding force. Examples of the coupling agent include silane coupling agents. Specific examples thereof include: silane coupling agents, such as 3-glycidoxypropyltrimethoxysilane, 3-glycidoxypropylmethyldimethoxysilane, 3-glycidoxypropylmethyldimethoxysilane, 2-(3,4-epoxycyclohexyl)ethyltrimethoxysilane, N-phenyl-γ-aminopropyltrimethoxysilane, N-(2-aminoethyl)3-aminopropylmethyldimethoxysilane, N-(2-aminoethyl)3-aminopropylmethyltrimethoxysilane, 3-aminopropyltriethoxysilane, 3-mercaptopropyltrimethoxysilane, vinyltrimethoxysilane, N-(2-(vinylbenzylamino)ethyl)3-aminopropyltrimethoxysilane hydrochloride, and 3-methacryloxypropyltrimethoxysilane. These may be used alone or in combination.

As the sealing member, epoxy resin compositions that are commercially available as sealing materials, seal materials, or adhesives have been known, and such commercially available products can be effectively used in the present disclosure. Among them, there are also epoxy resin compositions that are developed and are commercially available to be used in solar cells or organic EL elements, and such commercially available products can be particularly effectively used in the present disclosure. Examples of the commercially available epoxy resin compositions include: TB3118, TB3114, TB3124, and TB3125F (available from ThreeBond); World Rock 5910, World Rock 5920, and World Rock 8723 (available from Kyoritsu Chemical Co., Ltd.); and WB90US (P) (available from MORESCO Corporation).

In the present disclosure, a sealing sheet material may be used as the sealing material. The sealing sheet material is a material where an epoxy resin layer has been formed on a sheet in advance. In the sheet, glass or a film having high gas barrier properties is used. A sealing member and a second substrate can be formed at once by bonding the sealing sheet material onto the second substrate, followed by curing. A structure having a hollow part can be formed depending on a formation pattern of the epoxy resin layer formed on the sheet.

A method for forming the sealing member is not particularly limited and may be appropriately selected depending on the intended purpose. Examples of the method include a dispensing method, a wire bar method, a spin coating method, a roller coating method, a blade coating method, and a gravure coating method. Moreover, as a method for forming the sealing member, methods such as relief printing, offset printing, gravure printing, intaglio printing, rubber plate printing, and screen printing may be used.

Moreover, a passivation layer may be disposed between the sealing member and the second electrode. The passivation layer is not particularly limited and may be appropriately selected depending on the intended purpose, so long as the passivation layer is disposed in such a manner that the sealing member is not in contact with the second electrode. Examples of the passivation layer include aluminum oxide, silicon nitride, and silicon oxide.

<Other Members>

Other members are not particularly limited and may be appropriately selected depending on the intended purpose.

Hereinafter, one embodiment of a solar cell module of the present disclosure will be described with reference to drawings. In each drawing, the same reference numeral is given to the same component, and redundant description may be omitted.

<Structure of Solar Cell Module>

FIG. 1 is an explanatory view presenting one example of a structure of a solar cell module of the present disclosure. As presented in FIG. 1, a solar cell module 100 includes: a first substrate 1; and photoelectric conversion elements disposed on the first substrate 1, each of the photoelectric conversion elements including first electrodes 2a and 2b, a compact electron transport layer (compact layer) 3, a porous electron transport layer (porous layer) 4, a perovskite layer 5, a hole transport layer 6, and second electrodes 7a and 7b. Note that, the first electrode 2a or 2b and the second electrode 7a or 7b each have a path configured to pass current to an electrode extraction terminal. Moreover, in the solar cell module 100, the second substrate 10 is disposed so as to face the first substrate 1, so that the first substrate 1 and the second substrate 10 sandwich the photoelectric conversion elements. A sealing member 9 is disposed between the first substrate 1 and the second substrate 10.

In the solar cell module 100, the first electrode 2a and the first electrode 2b are separated by the hole transport layer 6 that is an extended continuous layer.

Figure 2:
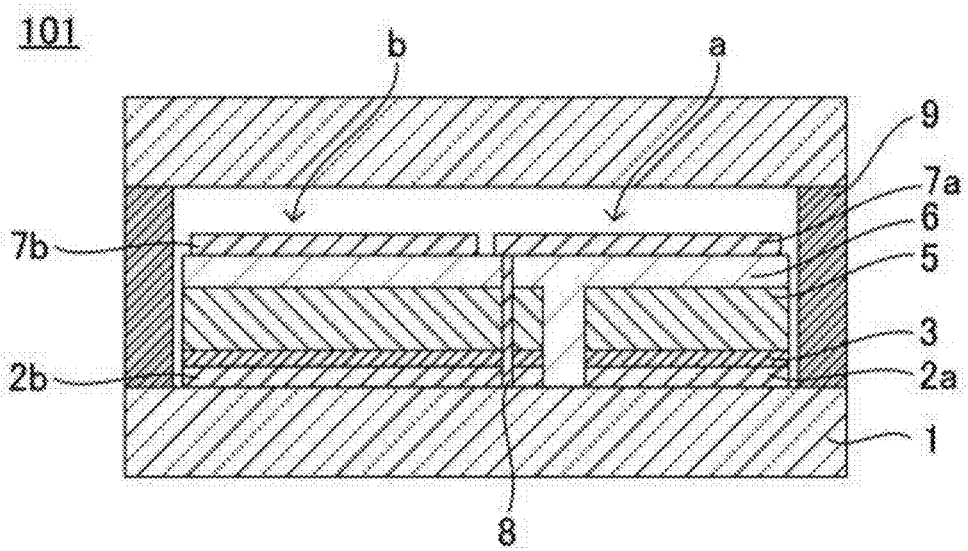
FIG. 2 is an explanatory view presenting another example of a structure of a solar cell module of the present disclosure.

FIG. 2 is an explanatory view presenting another example of a structure of a solar cell module of the present disclosure. As presented in FIG. 2, a solar cell module 101 is an embodiment where the porous electron transport layer (porous layer) 4 does not exist in the solar cell module 100 presented in FIG. 1.

Figure 3:
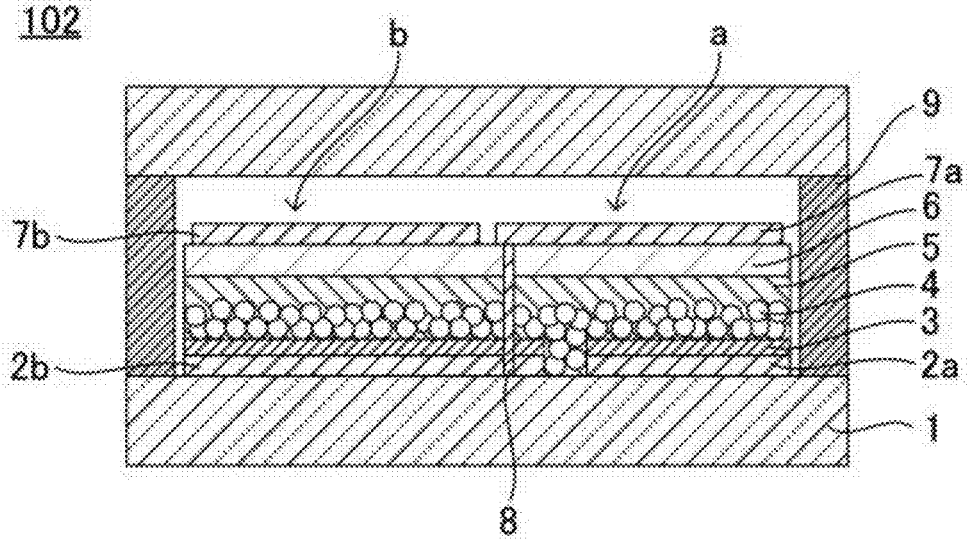
FIG. 3 is an explanatory view presenting another example of a structure of a solar cell module of the present disclosure.

FIG. 3 is an explanatory view presenting another example of a structure of a solar cell module of the present disclosure. As presented in FIG. 3, a solar cell module 102 is an embodiment where not only the hole transport layer 6 but also the porous electron transport layer (porous layer) 4 and the perovskite layer 5 are extended continuous layers in the solar cell module 100 presented in FIG. 1.

In the solar cell module 102, the first electrode 2a and the first electrode 2b are separated by the porous layer 4 and the perovskite layer 5 that are extended continuous layers.

Figure 4:
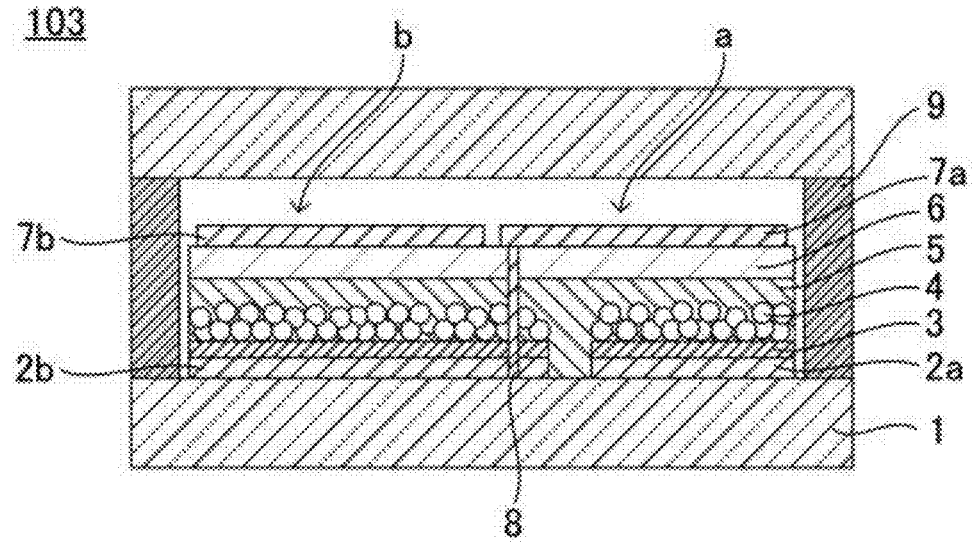
FIG. 4 is an explanatory view presenting another example of a structure of a solar cell module of the present disclosure.

FIG. 4 is an explanatory view presenting another example of a structure of a solar cell module of the present disclosure. As presented in FIG. 4, a solar cell module 103 is an embodiment where the porous layer 4 is not extended in the solar cell module 102 presented in FIG. 3.

In the solar cell module 103, the first electrode 2a and the first electrode 2b are separated by the perovskite layer 5 that is an extended continuous layer.

Figure 5:
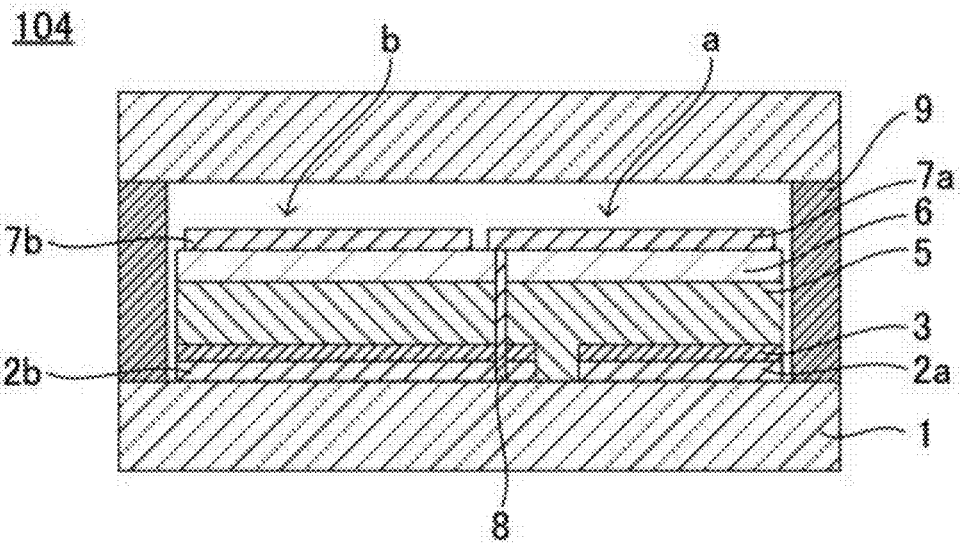
FIG. 5 is an explanatory view presenting another example of a structure of a solar cell module of the present disclosure.

FIG. 5 is an explanatory view presenting another example of a structure of a solar cell module of the present disclosure. As presented in FIG. 5, a solar cell module 104 is an embodiment where the porous layer 4 does not exist in the solar cell module 103 presented in FIG. 4.

Each of the solar cell modules 100 to 106 is sealed with the first substrate 1, the sealing member 9, and the second substrate 10. Therefore, it is possible to control an amount of moisture and a concentration of oxygen in a hollow part existing between the second electrode 7 and the second substrate 10. By controlling the amount of moisture and the concentration of oxygen in the hollow part of each of the solar cell modules 100 to 106, the power generation performance and the durability can be improved. That is, when the solar cell module further includes: the second substrate that is disposed so as to face the first substrate, so that the first substrate and the second substrate sandwich the photoelectric conversion elements; and the sealing member disposed between the first substrate and the second substrate and seals the photoelectric conversion elements, it is possible to control the amount of moisture and the concentration of oxygen in the hollow part, which can improve the power generation performance and the durability.

The concentration of oxygen in the hollow part is not particularly limited and may be appropriately selected depending on the intended purpose. However, the concentration thereof is preferably 0% or more but 21% or less, more preferably 0.05% or more but 10% or less, still more preferably 0.1% or more but 5% or less.

In each of the solar cell modules 100 to 106, the second electrode 7 and the second substrate 10 are not in contact with each other. Therefore, it is possible to prevent the second electrode 7 from being exfoliated and broken.

Moreover, each of the solar cell modules 100 to 106 includes a through part 8 configured to electrically connect the photoelectric conversion element a with the photoelectric conversion element b. In each of the solar cell modules 100 to 106, the photoelectric conversion element a and the photoelectric conversion element b are connected to each other in series, by electrically connecting the second electrode 7a of the photoelectric conversion element a with the first electrode 2b of the photoelectric conversion element b by the through part 8 penetrating through the hole transport layer 6. As described above, when a plurality of photoelectric conversion elements are connected in series, the open-circuit voltage of the solar cell module can be increased.

Note that, the through part 8 may penetrate through the first electrode 2 to reach the first substrate 1. Alternatively, the through part 8 may not reach the first substrate 1 by stopping the processing inside the first electrode 2. In the case where a shape of the through part 8 is a fine pore that penetrates through the first electrode 2 to reach the first substrate 1, when a total opening area of the fine pore is too large relative to an area of the through part 8, a decreased cross-sectional area of the film of the first electrode 2 results in an increased resistance value, which may cause reduction in a power generation efficiency. Therefore, a ratio of the total opening area of the fine pore to an area of the through part 8 is preferably 5/100 or more but 60/100 or less.

Moreover, a method for forming the through part is not particularly limited and may be appropriately selected depending on the intended purpose. Examples of the method include a sand blasting method, a water blasting method, a chemical etching method, a laser processing method, and a method using abrasive paper. Among them, the laser processing method is preferable because the fine pore can be formed without using sand, etching, and resist, and this makes it possible to process the fine pore in clean and reproducible manners. Furthermore, the reason why the laser processing method is preferable is as follows. Specifically, when the through part 8 is formed, it is possible to remove at least one of the compact layer 3, the porous layer 4, the perovskite layer 5, the hole transport layer 6, and the second electrode 7 through impact peeling using the laser processing method. Therefore, it is not necessary to provide a mask during lamination, and removal of the materials of which the photoelectric conversion element is formed and formation of the through part can be easily performed at one time.

Here, a space between the perovskite layer in the photoelectric conversion element a and the perovskite layer in the photoelectric conversion element b may be extended or may be separated. When they are separated, a distance therebetween is preferably 1 m or more but 100 m or less, more preferably 5 m or more but 50 m or less. When the distance between the perovskite layer in the photoelectric conversion element a and the perovskite layer in the photoelectric conversion element b is 1 m or more but 100 m or less, the porous titanium oxide layer and the perovskite layer are separated, and less recombination of electrons through diffusion is generated. Therefore, it makes it possible to maintain power generation efficiency even after exposure to light having a high illuminance for a long period of time. That is, when a distance between the electron transport layer and the perovskite layer in one photoelectric conversion element and the electron transport layer and the perovskite layer in the other photoelectric conversion element in at least two photoelectric conversion elements adjacent to each other is 1 m or more but 100 m or less, it is possible to maintain power generation efficiency even after exposure to light having a high illuminance for a long period of time. Here, the phrase "distance between the electron transport layer and the perovskite layer in one photoelectric conversion element and the electron transport layer and the perovskite layer in the other photoelectric conversion element in at least two photoelectric conversion elements adjacent to each other" means the shortest distance among distances between peripheries (end parts) of the electron transport layer and the perovskite layers in the photoelectric conversion elements.

The solar cell module of the present disclosure can be applied to power source devices by using it in combination with, for example, a circuit board configured to control generated electric current. Examples of the devices using such a power source device include electronic calculators and watches. In addition, the power source device including the solar cell module of the present disclosure can be applied to, for example, mobile phones, electronic notebooks, and electronic paper. The power source device including the solar cell module of the present disclosure can be used as an auxiliary power supply configured to prolong a continuously operating time of rechargeable electrical appliances or battery-type electrical appliances, or as a power source that can be used in the nighttime by using it in combination with a secondary battery. Moreover, the solar cell module of the present disclosure can be used in IoT devices or artificial satellites as self-supporting power supplies that require neither replacement of a cell nor power source wirings.

(Electronic Device)
An electronic device of the present disclosure includes: the solar cell module of the present disclosure; and a device configured to be driven by electric power generated through photoelectric conversion of the solar cell module. The electronic device of the present disclosure further includes other devices if necessary.

(Power Supply Module)
A power supply module of the present disclosure includes: the solar cell module of the present disclosure; and a power supply integrated circuit (IC). The power supply module of the present disclosure further includes other devices if necessary.

A specific embodiment of an electronic device including the solar cell module of the present disclosure and a device configured to be driven by electric power obtained through power generation of the solar cell module will be described.

Figure 6:
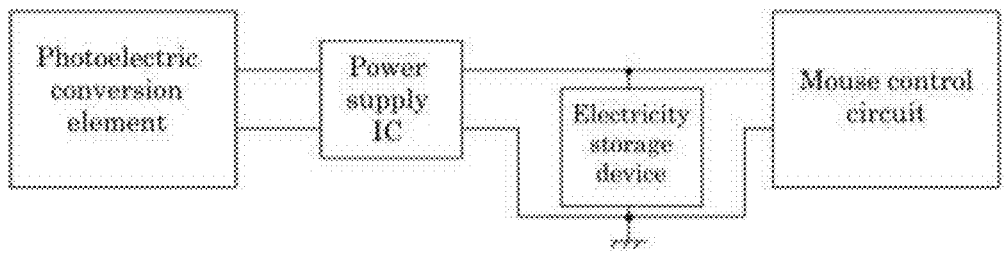
FIG. 6 is a block diagram of a mouse for a personal computer as one example of an electronic device of the present disclosure.

FIG. 6 is a block diagram of a mouse for a personal computer as one example of an electronic device of the present disclosure.

As presented in FIG. 6, a photoelectric conversion element of a solar cell module, a power supply IC, and an electricity storage device are combined and the supplied electric power is allowed to pass to a power supply of a control circuit of a mouse. As a result, the electricity storage device is charged when the mouse is not used, and the mouse can be driven by the electric power, and therefore such a mouse that requires neither wiring nor replacement of a cell can be obtained. Since a cell is not required, a weight thereof can be decreased, which is effective.

Figure 7:
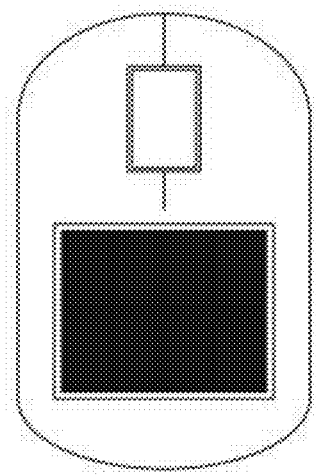
FIG. 7 is a schematic external view presenting one example of the mouse presented in FIG. 6.

FIG. 7 is a schematic external view presenting one example of the mouse presented in FIG. 6.

As presented in FIG. 7, a solar cell module, a power supply IC, and an electricity storage device are mounted inside a mouse, but an upper part of the photoelectric conversion element is covered with a transparent housing so that the photoelectric conversion element of the solar cell module receives light. Moreover, the whole housing of the mouse can be formed with a transparent resin. The arrangement of the photoelectric conversion element is not limited to the above. For example, the photoelectric conversion element may be arranged in a position to which light is emitted even when the mouse is covered with a hand, and such arrangement may be preferable.

Another embodiment of an electronic device including the solar cell module of the present disclosure and a device configured to be driven by electric power obtained through power generation of the solar cell module will be described.

Figure 8:
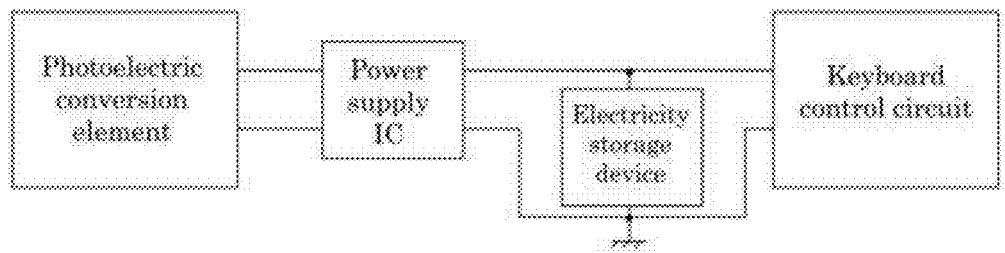
FIG. 8 is a block diagram of a keyboard for a personal computer as one example of an electronic device of the present disclosure.

FIG. 8 is a block diagram of a keyboard for a personal computer as one example of an electronic device of the present disclosure.

As presented in FIG. 8, a photoelectric conversion element of a solar cell module, a power supply IC, and an electricity storage device are combined, and the supplied electric power is allowed to pass to a power supply of a control circuit of a keyboard. As a result, the electricity storage device is charged when the keyboard is not used, and the keyboard can be driven by the electric power. Therefore, such a keyboard that requires neither wiring nor replacement of a cell can be obtained. Such a configuration is effective because a cell is not required and therefore a weight thereof can be decreased.

Figure 9:
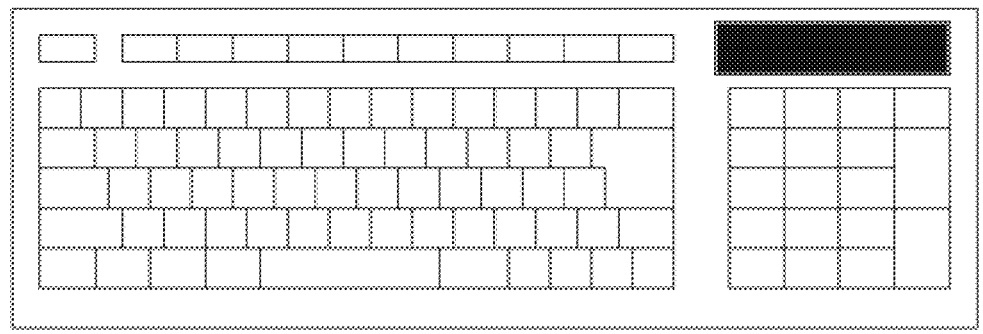
FIG. 9 is a schematic external view presenting one example of the keyboard presented in FIG. 8.

FIG. 9 is a schematic external view presenting one example of the keyboard presented in FIG. 8.

Figure 10:
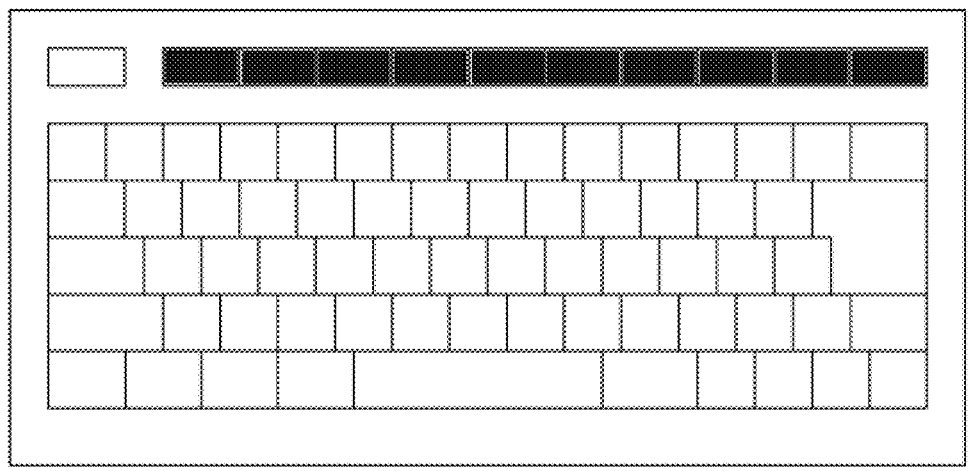
FIG. 10 is a schematic external view presenting another example of the keyboard presented in FIG. 8.

As presented in FIG. 9, a photoelectric conversion element of a solar cell module, a power supply IC, and an electricity storage device are mounted inside the keyboard, but an upper part of the photoelectric conversion element is covered with a transparent housing so that the photoelectric conversion element receives light. The whole housing of the keyboard can be formed with a transparent resin. The arrangement of the photoelectric conversion element is not limited to the above. In the case of a small keyboard in which a space for incorporating the photoelectric conversion element is small, a small photoelectric conversion element may be embedded in some keys as presented in FIG. 10, and such arrangement is effective.

Next, another embodiment of an electronic device including the solar cell module of the present disclosure and a device configured to be driven by electric power obtained through power generation of the solar cell module will be described.

Figure 11:
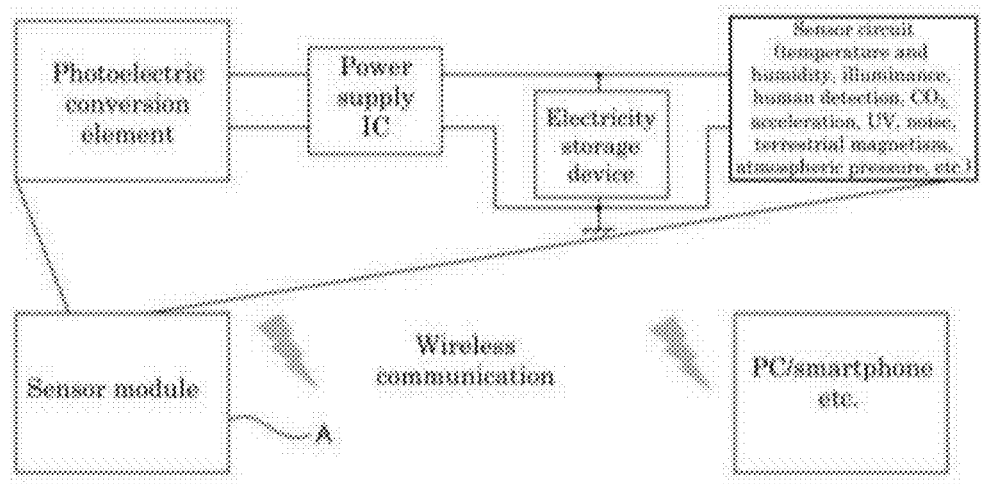
FIG. 11 is a block diagram of a sensor as one example of an electronic device of the present disclosure.

FIG. 11 is a block diagram of a sensor as one example of an electronic device of the present disclosure.

As presented in FIG. 11, a photoelectric conversion element of a solar cell module, a power supply IC, and an electricity storage device are combined, and the supplied electric power is allowed to pass to a power supply of a sensor circuit. As a result, a sensor module can be constituted without requiring connection to an external power supply and without requiring replacement of a cell. A sensing target is, for example, temperature and humidity, illuminance, human detection, $CO_2$, acceleration, UV, noise, terrestrial magnetism, and atmospheric pressure, and such an electronic device can be applied to various sensors, which is effective. As presented in FIG. 11, the sensor module is configured to sense a target to be measured on a regular basis and to transmit the read data to a personal computer (PC) or a smartphone through wireless communication.

It is expected that use of sensors is significantly increased as the internet of things (IoT) society approaches. Replacing batteries of numerous sensors one by one is time consuming and is not realistic. Moreover, a sensor is installed at a position such as a celling and a wall where a cell is not easily replaced, and this arrangement makes workability bad. The fact that electricity can be supplied by the photoelectric conversion element is also significantly advantageous. In addition, the solar cell module of the present disclosure has advantages that a high output can be obtained even with light of low illuminance and a high degree of freedom in installation can be achieved because dependence of light incident angle for the output is small.

Next, another embodiment of an electronic device including the solar cell module of the present disclosure and a device configured to be driven by electric power obtained through power generation of the solar cell module will be described.

Figure 12:
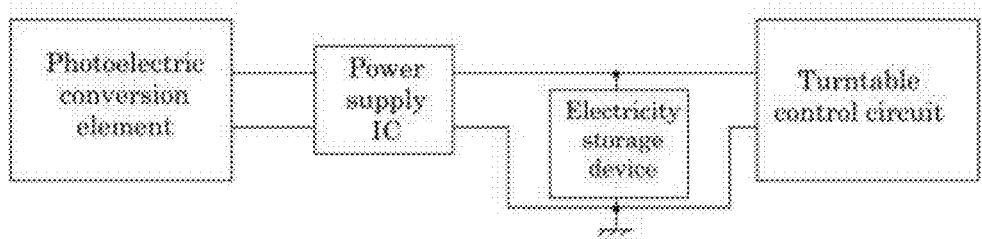
FIG. 12 is a block diagram of a turntable as one example of an electronic device of the present disclosure.

FIG. 12 is a block diagram of a turntable as one example of an electronic device of the present disclosure.

As presented in FIG. 12, the photoelectric conversion element, a power supply IC, and an electricity storage device are combined, and the supplied electric power is allowed to pass to a power supply of a turntable control circuit. As a result, a turntable can be constituted without requiring connection to an external power supply and without requiring replacement of a cell. The turntable is used in, for example, a display case in which products are displayed. Wiring of a power supply degrades appearance of the display, and moreover displayed products need to be removed at the time of replacing a cell, which is time-consuming. Use of the solar cell module of the present disclosure is effective because the aforementioned problems can be solved.

As described above, the electronic device including the solar cell module of the present disclosure and the device configured to be driven by electric power obtained through power generation of the solar cell module, and the power supply module have been described. However, the embodiments described are only part of applicable embodiments, and use of the solar cell module of the present disclosure is not limited to the above-described uses.

<Application>

The solar cell module of the present disclosure can function as a self-sustaining power supply, and electric power generated through photoelectric conversion can be used to drive a device. Since the solar cell module of the present disclosure can generate electricity by irradiation of light, it is not necessary to couple the electronic device to a power supply or to replace a cell. Therefore, the electronic device can be driven in a place where there is no power supply facility, the electronic device can be worn or carried, and the electronic device can be driven without replacement of a cell even in a place where a cell is not easily replaced. Moreover, when a dry cell is used, the electronic device becomes heavy by a weight of the dry cell, or the electronic device becomes large by a size of the dry cell. Therefore, there may be a problem in installing the electronic device on a wall or celling, or transporting the electronic device. However, since the solar cell module of the present disclosure is light and thin, it can be freely installed, and can be worn and carried, which is advantageous.

As described above, the solar cell module of the present disclosure can be used as a self-sustaining power supply, and can be combined with various electronic devices. For example, the solar cell module of the present disclosure can be used in combination with a display device (e.g., an electronic desk calculator, a watch, a mobile phone, an electronic organizer, and electronic paper), an accessory device of a personal computer (e.g., a mouse and a keyboard), various sensor devices (e.g., a temperature and humidity sensor and a human detection sensor), a transmitter (e.g., a beacon and a global positioning system (GPS)), and numerous electronic devices (e.g., auxiliary lamps and remote controllers).

The solar cell module of the present disclosure is widely applied because it can generate electricity particularly with light of low illuminance and can generate electricity indoors and in further darker shade. Moreover, the solar cell module is highly safe because liquid leakage found in the case of a dry cell does not occur, and accidental ingestion found in the case of a button cell does not occur. Furthermore, the solar cell module can be used as an auxiliary power supply for the purpose of prolonging a continuous operation time of a charge-type or dry cell-type electrical appliance. As described above, when the solar cell module of the present disclosure is combined with a device configured to be driven by electric power generated through photoelectric conversion of the solar cell module, it is possible to obtain an electronic device that is light and easy to use, has a high degree of freedom in installation, does not require replacement of a cell, is excellent in safety, and is effective in decreasing environmental loads.

Figure 13:
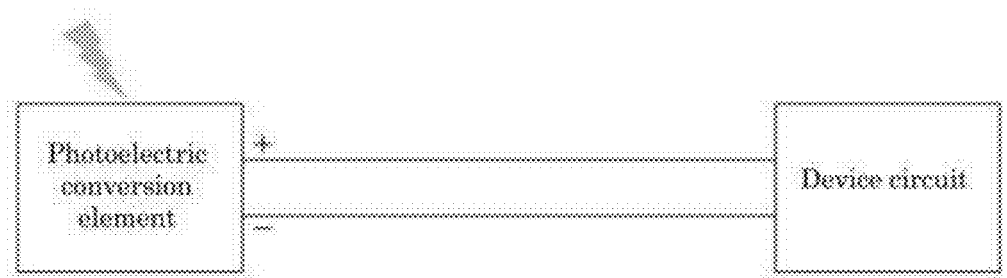
FIG. 13 is a block diagram presenting one example of an electronic device of the present disclosure.

FIG. 13 presents a basic configuration diagram of an electronic device obtained by combining the solar cell module of the present disclosure with a device configured to be driven by electric power generated through photoelectric conversion of the solar cell module. The electronic device can generate electricity when the photoelectric conversion element is irradiated with light, and can extract electric power. A circuit of the device can be driven by the generated electric power.

Figure 14:
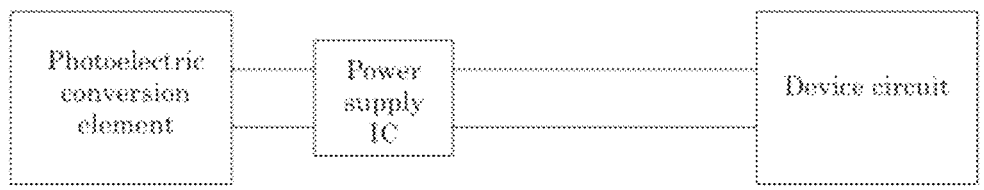
FIG. 14 is a block diagram presenting one example where a power supply IC is further incorporated into the electronic device presented in FIG. 13.

Since the output of the photoelectric conversion element of the solar cell module varies depending on circumferential illuminance, the electronic device presented in FIG. 13 may not be stably driven in some cases. In this case, as presented in FIG. 14, a power supply IC for a photoelectric conversion element can be incorporated between the photoelectric conversion element and the circuit of the device in order to supply stable voltage to a side of the circuit, and such arrangement is effective.

Figure 15:
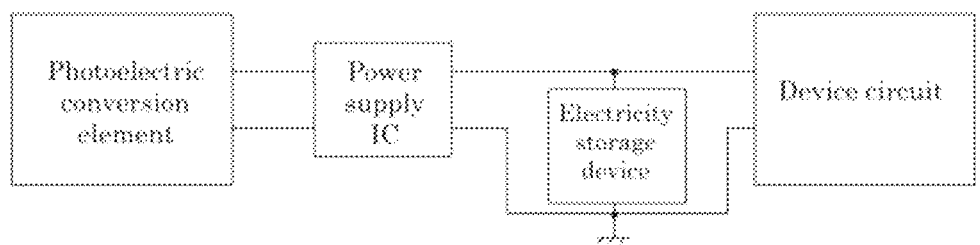
FIG. 15 is a block diagram presenting one example where an electricity storage device is further incorporated into the electronic device presented in FIG. 14.

The photoelectric conversion element of the solar cell module can generate electricity so long as light of sufficient illuminance is emitted. However, when there is not enough illuminance to generate electricity, desired electric power cannot be obtained, which is a disadvantage of the photoelectric conversion element. In this case, as presented in FIG. 15, when an electricity storage device such as a capacitor is mounted between a power supply IC and a device circuit, excess electric power from the photoelectric conversion element can be stored in the electricity storage device. In addition, the electric power stored in the electricity storage device can be supplied to a device circuit to thereby enable stable operation when the illuminance is too low or even when light is not applied to the photoelectric conversion element.

As described above, the electronic device obtained by combining the solar cell module of the present disclosure with the device circuit can be driven even in an environment without a power supply, does not require replacement of a cell, and can be stably driven in combination with a power supply IC or an electricity storage device. Therefore, it is possible to make the most of advantages of the photoelectric conversion element.

Meanwhile, the solar cell module of the present disclosure can also be used as a power supply module, and such use is effective. As presented in FIG. 16, for example, when the solar cell module of the present disclosure is coupled to a power supply IC for a photoelectric conversion element, a DC power supply module capable of supplying electric power generated through photoelectric conversion of the photoelectric conversion element of the solar cell module to the power supply IC at a predetermined voltage level can be constituted.

Figure 17:
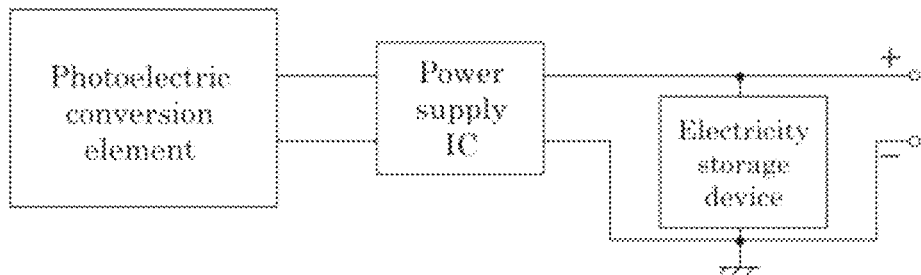
FIG. 17 is a block diagram presenting one example where an electricity storage device is further incorporated into the power supply module presented in FIG. 16.

Moreover, as presented in FIG. 17, when an electricity storage device is added to a power supply IC, electric power generated by the photoelectric conversion element of the solar cell module can be stored in the electricity storage device. Therefore, a power supply module capable of supplying electric power can be constituted when the illuminance is too low or even when light is not applied to the photoelectric conversion element.

Figure 16:
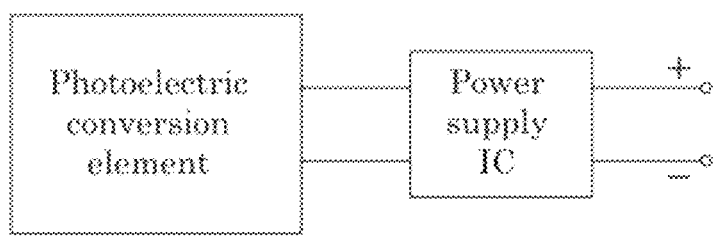
FIG. 16 is a block diagram presenting one example of a power supply module of the present disclosure.

The power supply modules of the present disclosure presented in FIG. 16 and FIG. 17 can be used as a power supply module without replacement of a cell as in case of primary cells known in the art.

EXAMPLES

The present disclosure will be described in more detail by way of Examples and Comparative Examples. The present disclosure should not be construed as being limited to these Examples.

Synthesis Example 1

Synthesis of Polymer Having Recurring Unit Represented by General Formula (1)

Polymer (A-11) expressed by the following Structural Formula was synthesized through the following reaction.

[Chem. 28]

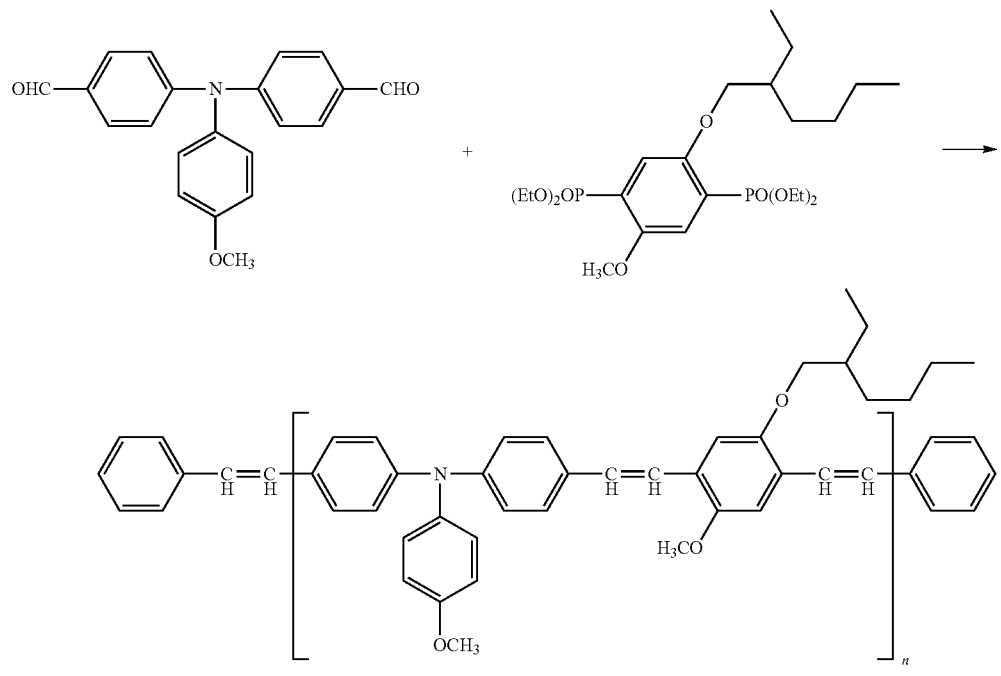

(A-11)

Here, n represents an integer that is 2 or more and allows the polymer (A-11) to have a weight average molecular weight of 2,000 or more.

First, a 100 mL-four neck flask was charged with the aforementioned dialdehyde compound (0.66 g) (2.0 mmol) and the aforementioned diphosphonate compound (1.02 g) (2.0 mmol), and the resultant was purged with nitrogen, followed by addition of tetrahydrofuran (75 ml). To the solution, a 1.0 mol/dm$^3$ tetrahydrofuran solution of potassium t-butoxide (6.75 mL) (6.75 mmol) was added dropwise, and the resultant solution was stirred for 2 hours at room temperature. Diethyl benzylphosphonate and benzaldehyde were sequentially added thereto, followed by stirring for 2 hours. Acetic acid (about 1 mL) was added thereto to terminate the reaction, and the solution was washed with water. After the solvent was removed under reduced pressure, the resultant was subjected to purification through reprecipitation using tetrahydrofuran and methanol, to obtain polymer (A-11) (0.95 g) expressed by the above Structural Formula. The obtained polymer (A-11) expressed by the above Structural Formula was found to have a weight average molecular weight of 20,000 in terms of polystyrene, the weight average molecular weight being measured through gel filtration chromatography (GPC). An ionization potential of the polymer (A-11) measured using a photoemission yield spectroscopy (AC-2, obtained from RIKEN KEIKI CO., LTD.) was 5.22 eV. All of the below-described ionization potentials were measured by AC-2.

Example 1

<Production of Solar Cell Module>
First, a liquid obtained by dissolving, in isopropyl alcohol (10 mL), titanium diisopropoxide bis(acetylacetone) isopropyl alcohol solution (obtained from Tokyo Chemical Industry Co., Ltd., B3395, 75% by mass) (0.36 g) was coated on an FTO glass substrate (obtained from Nippon Sheet Glass Co., Ltd.) by the spin coating method. The coating liquid was dried at 120 degrees Celsius for 3 minutes and was baked at 450 degrees Celsius for 30 minutes to produce a first electrode and a compact electron transport layer (compact layer) on the first substrate. Note that, the compact layer was set to have an average thickness of from 10 m through 40 m.

Next, a dispersion liquid obtained by diluting titanium oxide paste (obtained from Greatcell Solar Limited, product name: MPT-20) with α-terpineol (obtained from KANTO CHEMICAL CO., INC.) was coated on the compact layer by the spin coating method. Then, the resultant was dried at 120 degrees Celsius for 3 minutes and was baked at 550 degrees Celsius for 30 minutes.
Then, a solution of acetonitrile (obtained from KANTO CHEMICAL CO., INC.) (0.1 M) (note that, M means mol/dm$^3$) that had dissolved lithium bis(trifluoromethanesulfonyl)imide (obtained from KANTO CHEMICAL CO., INC., product number: 38103) was coated on the aforementioned film by the spin coating method and was baked at 450 degrees Celsius for 30 minutes to produce a porous electron transport layer (porous layer). Here, the porous layer was set to have an average thickness of 150 nm.

Next, lead(II) iodide (obtained from Tokyo Chemical Industry Co., Ltd., L0279, 0.5306 g), lead(II) bromide (obtained from Tokyo Chemical Industry Co., Ltd., L0288, 0.0736 g), methylammonium bromide (obtained from Tokyo Chemical Industry Co., Ltd., M2589, 0.0224 g), formamidine hydroiodide (obtained from Tokyo Chemical Industry Co., Ltd., F0974, 0.1876 g), and potassium iodide (obtained from KANTO CHEMICAL CO., INC., 32351, 0.0112 g) were added to N,N-dimethylformamide (obtained from KANTO CHEMICAL CO., INC., 0.8 ml) and dimethyl sulfoxide (obtained from KANTO CHEMICAL CO., INC., 0.2 ml), and the resultant was heated and stirred at 60 degrees Celsius, to thereby obtain a solution. The solution was coated on the above porous layer by the spin coating method while chlorobenzene (obtained from KANTO CHEMICAL CO., INC., 0.3 ml) was added thereto to form a perovskite film. Then, the perovskite film was dried at 150 degrees Celsius for 30 minutes to produce a perovskite layer. Note that, the perovskite layer was set to have an average thickness of 200 nm or more but 350 nm or less.

The laminate obtained by the above steps was subjected to laser processing to form a groove so that a distance between the adjacent laminates would be 10 m. Then, the polymer (A-11) (weight average molecular weight=20,000, ionization potential: 5.22 eV) (36.8 mg) represented by the above Structural Formula, 2,2(7,7(-tetrakis-(N,N-di-p-methoxyphenylamine)9,9(-spirobifluorene))) (hereinafter, referred to as "spiro-OMeTAD", obtained from Merck, molecular weight=1225.4, ionization potential=5.09 eV) (36.8 mg), lithium bis(trifluoromethanesulfonyl)imide (4.9 mg), 4-t-butylpyridine (obtained from Tokyo Chemical Industry Co., Ltd., B0388) (6.8 mg), and tris(2-(1H-pyrazol-1-yl)-4-tert-butylpyridine)cobalt(III) hexafluorophosphate (obtained from Greatcell Solar, MS210205) (0.1 mg) were dissolved in chlorobenzene (obtained from KANTO CHEMICAL CO., INC.) (1.5 mL). On the laminated obtained by the aforementioned steps, the obtained solution was coated by the spin coating method to produce a hole transport layer. An average thickness of the hole transport layer (a part on the perovskite layer) was set to from 100 nm through 200 nm. A difference between ionization potentials of the two kinds of the hole transport materials was 0.13 eV. Gold (obtained from TANAKA KIKINZOKU KOGYO K. K.) (100 nm) was deposited on the laminate under vacuum.

End parts of the first substrate and the second substrate provided with sealing members were subjected to an etching treatment through laser processing and then were subjected to laser processing to form through holes (conduction parts) for connecting photoelectric conversion elements in series. Next, silver was deposited on the above laminate under vacuum to thereby form a second electrode having a thickness of about 100 mn. Through the mask film formation, a distance between adjacent second electrodes would be 200 μm. Silver was also deposited on the inner walls of the through holes, and it was confirmed that the adjacent photoelectric conversion elements were connected in series. The number of the photoelectric conversion elements disposed in series was 6.

Then, an ultraviolet curable resin (obtained from Three-Bond Holdings Co., Ltd., product name: TB3118) was coated with a dispenser (obtained from SAN-EI TECH Ltd., product name: 2300N) on end parts of the first substrate so that the photoelectric conversion elements (power generation regions) were surrounded. Then, it was transferred to a glove box that had been controlled to have a low humidity (dew point: −30 degrees Celsius) and a concentration of oxygen of 0.2%. Then, a cover glass as the second substrate was disposed on the ultraviolet curable resin and the ultraviolet curable resin was cured through ultraviolet irradiation to seal the power generation regions. As a result, the solar cell module 1 of the present disclosure as presented in FIG. 1 was produced. Each distance between layers constituting the photoelectric conversion elements adjacent to each other is presented in Table 1.

\<Evaluation of Solar Cell Module\>

While the solar cell module 1 obtained was irradiated with light by a solar simulator (AM1.5, 10 mW/cm$^2$), the solar cell module 1 obtained was evaluated for characteristics of the solar cell (initial characteristics) using a solar cell evaluation system (obtained from NF Corporation, product name: As-510-PV03). Furthermore, after the above solar simulator was used to continuously emit light for 100 hours under the aforementioned conditions, the characteristics of the solar cell (characteristics after continuous irradiation for 100 hours) were evaluated in the same manner as described above.

The evaluated characteristics of the solar cell are the open-circuit voltage, the short-circuit current density, the shape factor, and the conversion efficiency (power generation efficiency). A rate of the conversion efficiency in the characteristics after continuous irradiation for 100 hours relative to the conversion efficiency in the initial characteristics was determined as a maintenance rate of the conversion efficiency. Results thereof were presented in Table 3.

Example 2

A solar cell module 2 presented in FIG. 1 was produced in the same manner as in Example 1 except that the first electrodes, the compact layers, the porous layers, and the perovskite layers in the photoelectric conversion elements adjacent to each other were set to have a distance of 40 m. Each distance between the layers constituting the photoelectric conversion elements adjacent to each other is presented in Table 1. The solar cell module 2 was evaluated in the same manner as in Example 1. Evaluation results were presented in Table 3.

Example 3

A solar cell module 3 presented in FIG. 1 was produced in the same manner as in Example 1 except that spiro-OMeTAD (obtained from Merck, molecular weight=1225.4, ionization potential=5.09 eV) (36.8 mg) was changed to a compound expressed by the following (C-1) (molecular weight: 844.1, ionization potential: 5.21 eV) (36.8 mg). A difference between ionization potentials of the two kinds of the hole transport materials was 0.01 eV. Each distance between the layers constituting the photoelectric conversion elements adjacent to each other is presented in Table 1. The solar cell module 3 was evaluated in the same manner as in Example 1. Results were presented in Table 3.

Example 4

A solar cell module 4 presented in FIG. 1 was produced in the same manner as in Example 1 except that the polymer (A-11) expressed by the above Structural Formula (weight average molecular weight=20,000, ionization potential: 5.22 eV) (36.8 mg) was changed to a polymer (B-1) expressed by the following Formula (obtained from Aldrich, "P3HT", weight average molecular weight=50,000, ionization potential=5.0 eV), and spiro-OMeTAD (obtained from Merck, molecular weight=1225.4, ionization potential=5.09 eV) (36.8 mg) was changed to a compound (C-2) expressed by the following Formula (molecular weight: 554.9, ionization potential=5.05 eV). A difference between ionization potentials of the two kinds of the hole transport materials was 0.05 eV. Each distance between the layers constituting the photoelectric conversion elements adjacent to each other is presented in Table 1. The solar cell module 4 was evaluated in the same manner as in Example 1. Results were presented in Table 3.

[Chem. 30]

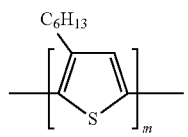

(B-1)

Here, m represents an integer that is 2 or more and allows the polymer (B-1) represented by the aforementioned Formula to have a weight average molecular weight of 2,000 or more.

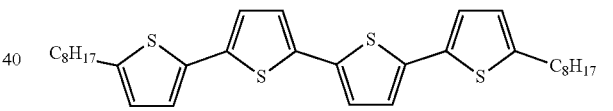

(C-2)

Example 5

A solar cell module 5 presented in FIG. 2 was produced in the same manner as in Example 1 except that the porous

[Chem. 29]

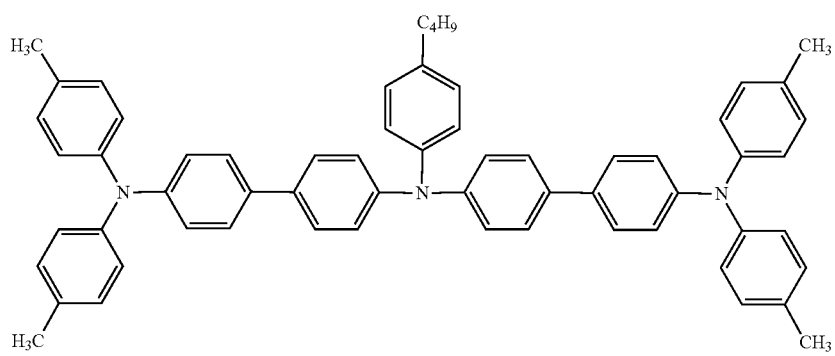

(C-1)

layer was not formed. Each distance between the layers constituting the photoelectric conversion elements adjacent to each other is presented in Table 1. The solar cell module 5 was evaluated in the same manner as in Example 1. Results were presented in Table 3.

Example 6

A solar cell module 6 was produced in the same manner as in Example 5 except that the compact layer was changed to a compact layer formed of tin oxide that was formed through sputtering. Each distance between the layers constituting the photoelectric conversion elements adjacent to each other is presented in Table 1. The solar cell module 6 was evaluated in the same manner as in Example 1. Results were presented in Table 3.

Example 7

A solar cell module 7 was produced in the same manner as in Example 6 except that cesium iodide (0.0143 g) was further used in addition to lead(II) iodide (0.5306 g), lead(II) bromide (0.0736 g), methylamine bromide (0.0224 g), formamidine iodide (0.1876 g), and potassium iodide (0.0112 g), which were used for forming the perovskite layer in Example 6. Each distance between the layers constituting the photoelectric conversion elements adjacent to each other is presented in Table 1. The solar cell module 7 was evaluated in the same manner as in Example 1. Results were presented in Table 3.

Example 8

A solar cell module 8 was produced in the same manner as in Example 5 except that the polymer (A-11) in the hole transport materials was changed to a polymer (A-11) (weight average molecular weight Mw=122,000). Each distance between the layers constituting the photoelectric conversion elements adjacent to each other is presented in Table 1. The solar cell module 8 was evaluated in the same manner as in Example 1. Results were presented in Table 3.

Example 9

A solar cell module 9 was produced in the same manner as in Example 5 except that the polymer (A-11) in the hole transport materials was changed to a polymer (A-11) (weight average molecular weight Mw=282,000). Each distance between the layers constituting the photoelectric conversion elements adjacent to each other is presented in Table 1. The solar cell module 9 was evaluated in the same manner as in Example 1. Results were presented in Table 3.

Example 10

A solar cell module 10 was produced in the same manner as in Example 5 except that the polymer (A-11) in the hole transport materials was changed to a polymer (A-11) (weight average molecular weight Mw=282,000), and the "spiro-OMeTAD" was changed to the compound expressed by the (C-1) (molecular weight: 844.1, ionization potential: 5.21 eV). Each distance between the layers constituting the photoelectric conversion elements adjacent to each other is presented in Table 1. The solar cell module 10 was evaluated in the same manner as in Example 1. Results were presented in Table 3.

Example 11

A solar cell module 11 was produced in the same manner as in Example 5 except that the polymer (A-11) in the hole transport materials was changed to a polymer (A-11) (weight average molecular weight Mw=282,000), and the "spiro-OMeTAD" was changed to the compound expressed by the above compound (C-2) (molecular weight: 554.9, ionization potential=5.05 eV). Each distance between the layers constituting the photoelectric conversion elements adjacent to each other is presented in Table 1. The solar cell module 11 was evaluated in the same manner as in Example 1. Results were presented in Table 3.

Example 12

A solar cell module 12 was produced in the same manner as in Example 5 except that the polymer (A-11) in the hole transport materials was changed to a compound (C-3) (molecular weight=2,157, ionization potential=5.23 eV). Each distance between the layers constituting the photoelectric conversion elements adjacent to each other is presented in Table 1. The solar cell module 12 was evaluated in the same manner as in Example 1. Results were presented in Table 3.

Example 13

A solar cell module 13 was produced in the same manner as in Example 5 except that the polymer (A-11) in the hole transport materials was changed to a compound (C-3) (molecular weight=2,157, ionization potential=5.23 eV), and the "spiro-OMeTAD" was changed to the compound expressed by the above (C-1) (molecular weight: 844.1, ionization potential: 5.21 eV). Each distance between the layers constituting the photoelectric conversion elements adjacent to each other is presented in Table 1. The solar cell module 13 was evaluated in the same manner as in Example 1. Results were presented in Table 3.

Example 14

A solar cell module 14 was produced in the same manner as in Example 5 except that the polymer (A-11) in the hole transport materials was changed to a compound (C-3) (molecular weight=2,157, ionization potential=5.23 eV), and the "spiro-OMeTAD" was changed to the compound expressed by the above compound (C-2) (molecular weight: 554.9, ionization potential=5.05 eV). Each distance between the layers constituting the photoelectric conversion elements adjacent to each other is presented in Table 1. The solar cell module 14 was evaluated in the same manner as in Example 1. Results were presented in Table 3.

Example 15

A solar cell module 15 was produced in the same manner as in Example 7 except that potassium iodide (0.0112 g) was not included among lead(II) iodide (0.5306 g), lead(II) bromide (0.0736 g), methylamine bromide (0.0224 g), formamidine iodide (0.1876 g), potassium iodide (0.0112 g), and cesium iodide (0.0143 g) that were used when the perovskite layer was formed; and the weight of cesium iodide was increased (0.0318 g). Each distance between the layers constituting the photoelectric conversion elements adjacent to each other is presented in Table 1. The solar cell module 15 was evaluated in the same manner as in Example 1. Results were presented in Table 3.

Example 16

A solar cell module 16 was produced in the same manner as in Example 15 except that antimony iodide (0.0204 g) was used in addition to lead(II) iodide (0.5306 g), lead(II) bromide (0.0736 g), methylamine bromide (0.0224 g), formamidine iodide (0.1876 g), and cesium iodide (0.0318 g) that were used when the perovskite layer was formed. Each distance between the layers constituting the photoelectric conversion elements adjacent to each other is presented in Table 1. The solar cell module 16 was evaluated in the same manner as in Example 1. Results were presented in Table 3.

Example 17

A solar cell module 17 was produced in the same manner as in Example 6 except that the weight of the polymer (A-11) (weight average molecular weight=20,000, ionization potential: 5.22 eV) in the hole transport material was changed to 51.5 mg, and the weight of spiro-OMeTAD (obtained from Merck, molecular weight=1225.4, ionization potential=5.09 eV) was changed to 22.1 mg. Each distance between the layers constituting the photoelectric conversion elements adjacent to each other is presented in Table 1. The solar cell module 17 was evaluated in the same manner as in Example 1. Results were presented in Table 3.

Example 18

A solar cell module 18 was produced in the same manner as in Example 6 except that the weight of the polymer (A-11) (weight average molecular weight=20,000, ionization potential: 5.22 eV) in the hole transport material was changed to 44.2 mg, and the weight of spiro-OMeTAD (obtained from Merck, molecular weight=1225.4, ionization potential=5.09 eV) was changed to 66.2 mg. Each distance between the layers constituting the photoelectric conversion elements adjacent to each other is presented in Table 1. The solar cell module 18 was evaluated in the same manner as in Example 1. Results were presented in Table 3.

Comparative Example 1

A solar cell module 19 presented in FIG. 3 was produced in the same manner as in Example 1 except that the porous layer and the perovskite layer were extended continuous layers. Each distance between the layers constituting the photoelectric conversion elements adjacent to each other is presented in Table 1. The solar cell module 19 was evaluated in the same manner as in Example 1. Results were presented in Table 3.

Comparative Example 2

A solar cell module 20 presented in FIG. 3 was produced in the same manner as in Example 1 except that the first electrodes and the compact layers in the photoelectric conversion elements adjacent to each other were set to have a distance of 40 m, and the porous layer and the perovskite layer were extended continuous layers. Each distance between the layers constituting the photoelectric conversion elements adjacent to each other is presented in Table 1. The solar cell module 20 was evaluated in the same manner as in Example 1. Results were presented in Table 3.

Comparative Example 3

A solar cell module 21 presented in FIG. 4 was produced in the same manner as in Example 1 except that the first electrodes, the compact layers, and the porous layers in the photoelectric conversion elements adjacent to each other were set to have a distance of 40 m, and the perovskite layer was an extended continuous layer. Each distance between the layers constituting the photoelectric conversion elements adjacent to each other is presented in Table 1. The solar cell module 21 was evaluated in the same manner as in Example 1. Results were presented in Table 3.

Comparative Example 4

A solar cell module 22 presented in FIG. 1 was produced in the same manner as in Example 1 except that the polymer (A-11) expressed by the above Structural Formula (weight average molecular weight=20,000, ionization potential: 5.22 eV) (36.8 mg) and spiro-OMeTAD (obtained from Merck, molecular weight=1225.4, ionization potential=5.09 eV) (36.8 mg) were changed to spiro-OMeTAD (obtained from Merck, molecular weight=1225.4, ionization potential=5.09 eV) (73.6 mg). Each distance between the layers constituting the photoelectric conversion elements adjacent to each other is presented in Table 1. The solar cell module 22 was evaluated in the same manner as in Example 1. Results were presented in Table 3.

TABLE 1

| | | Distance between layers constituting photoelectric conversion elements adjacent to each other | | | | | |
|---|---|---|---|---|---|---|---|
| | Solar cell module No. | First electrode (μm) | Compact layer (μm) | Porous layer (μm) | Perovskite layer (μm) | Hole transport layer (μm) | Second electrode (μm) | Difference between ionization potentials |
| Example 1 | 1 | 10, Discontinuous | 10, Discontinuous | 10, Discontinuous | 10, Discontinuous | Continuous | 200 | 0.13 eV |
| Example 2 | 2 | 40, Discontinuous | 40, Discontinuous | 40, Discontinuous | 40, Discontinuous | Continuous | 200 | 0.13 eV |
| Example 3 | 3 | 10, Discontinuous | 10, Discontinuous | 10, Discontinuous | 10, Discontinuous | Continuous | 200 | 0.01 eV |
| Example 4 | 4 | 10, Discontinuous | 10, Discontinuous | 10, Discontinuous | 10, Discontinuous | Continuous | 200 | 0.05 eV |
| Example 5 | 5 | 10, Discontinuous | 10, Discontinuous | — | 10, Discontinuous | Continuous | 200 | 0.13 eV |
| Example 6 | 6 | 10, Discontinuous | 10, Discontinuous | — | 10, Discontinuous | Continuous | 200 | 0.13 eV |
| Example 7 | 7 | 10, Discontinuous | 10, Discontinuous | — | 10, Discontinuous | Continuous | 200 | 0.13 eV |
| Example 8 | 8 | 10, Discontinuous | 10, Discontinuous | — | 10, Discontinuous | Continuous | 200 | 0.13 eV |
| Example 9 | 9 | 10, Discontinuous | 10, Discontinuous | — | 10, Discontinuous | Continuous | 200 | 0.13 eV |
| Example 10 | 10 | 10, Discontinuous | 10, Discontinuous | — | 10, Discontinuous | Continuous | 200 | 0.13 eV |
| Example 11 | 11 | 10, Discontinuous | 10, Discontinuous | — | 10, Discontinuous | Continuous | 200 | 0.13 eV |
| Example 12 | 12 | 10, Discontinuous | 10, Discontinuous | — | 10, Discontinuous | Continuous | 200 | 0.13 eV |

TABLE 1-continued

| | Solar cell module No. | First electrode (μm) | Compact layer (μm) | Porous layer (μm) | Perovskite layer (μm) | Hole transport layer (μm) | Second electrode (μm) | Difference between ionization potentials |
|---|---|---|---|---|---|---|---|---|
| Example 13 | 13 | 10, Discontinuous | 10, Discontinuous | — | 10, Discontinuous | 10, Discontinuous | Continuous | 200 | 0.14 eV |
| Example 14 | 14 | 10, Discontinuous | 10, Discontinuous | — | 10, Discontinuous | 10, Discontinuous | Continuous | 200 | 0.02 eV |
| Example 15 | 15 | 10, Discontinuous | 10, Discontinuous | — | 10, Discontinuous | 10, Discontinuous | Continuous | 200 | 0.18 eV |
| Example 16 | 16 | 10, Discontinuous | 10, Discontinuous | — | 10, Discontinuous | 10, Discontinuous | Continuous | 200 | 0.13 eV |
| Example 17 | 17 | 10, Discontinuous | 10, Discontinuous | — | 10, Discontinuous | 10, Discontinuous | Continuous | 200 | 0.13 eV |
| Example 18 | 18 | 10, Discontinuous | 10, Discontinuous | — | 10, Discontinuous | 10, Discontinuous | Continuous | 200 | 0.13 eV |
| Comparative Example 1 | 19 | 10, Discontinuous | 10, Discontinuous | Continuous | Continuous | Continuous | Continuous | 200 | 0.13 eV |
| Comparative Example 2 | 20 | 40, Discontinuous | 40, Discontinuous | Continuous | Continuous | Continuous | Continuous | 200 | 0.13 eV |
| Comparative Example 3 | 21 | 40, Discontinuous | 40, Discontinuous | 40, Discontinuous | Continuous | Continuous | Continuous | 200 | 0.13 eV |
| Comparative Example 4 | 22 | 10, Discontinuous | 10, Discontinuous | 10, Discontinuous | 10, Discontinuous | Continuous | Continuous | 200 | 0.13 eV |

Distance between layers constituting photoelectric conversion elements adjacent to each other

TABLE 2

| | Solar cell module No. | Hole transport layer Polymer or compoud: A | Low molecular weight compound: B | Mass ratio (A:B) |
|---|---|---|---|---|
| Example 1 | 1 | A-11 (Mw = 20,000) | spiro-OMeTAD (M = 1225.4) | 1:1 |
| Example 2 | 2 | A-11 (Mw = 20,000) | spiro-OMeTAD (M = 1225.4) | 1:1 |
| Example 3 | 3 | A-11 (Mw = 20,000) | C-1 (M = 844.1) | 1:1 |
| Example 4 | 4 | B-1 (Mw = 50,000) | C-2 (M = 554.9) | 1:1 |
| Example 5 | 5 | A-11 (Mw = 20,000) | spiro-OMeTAD (M = 1225.4) | 1:1 |
| Example 6 | 6 | A-11 (Mw = 20,000) | spiro-OMeTAD (M = 1225.4) | 1:1 |
| Example 7 | 7 | A-11 (Mw = 20,000) | spiro-OMeTAD (M = 1225.4) | 1:1 |
| Example 8 | 8 | A-11 (Mw = 122,000) | spiro-OMeTAD (M = 1225.4) | 1:1 |
| Example 9 | 9 | A-11 (Mw = 282,000) | spiro-OMeTAD (M = 1225.4) | 1:1 |
| Example 10 | 10 | A-11 (Mw = 282,000) | C-1 (M = 844.1) | 1:1 |
| Example 11 | 11 | A-11 (Mw = 282,000) | C-2 (M = 554.9) | 1:1 |
| Example 12 | 12 | C-3 (M = 2,157) | spiro-OMeTAD (M = 1225.4) | 1:1 |
| Example 13 | 13 | C-3 (M = 2,157) | C-1 (M = 844.1) | 1:1 |
| Example 14 | 14 | C-3 (M = 2,157) | C-2 (M = 554.9) | 1:1 |
| Example 15 | 15 | A-11 (Mw = 20,000) | spiro-OMeTAD (M = 1225.4) | 1:1 |
| Example 16 | 16 | A-11 (Mw = 20,000) | spiro-OMeTAD (M = 1225.4) | 1:1 |
| Example 17 | 17 | A-11 (Mw = 20,000) | spiro-OMeTAD (M = 1225.4) | 7:3 |
| Example 18 | 18 | A-11 (Mw = 20,000) | spiro-OMeTAD (M = 1225.4) | 4:6 |
| Comparative Example 1 | 19 | A-11 (Mw = 20,000) | spiro-OMeTAD (M = 1225.4) | 1:1 |
| Comparative Example 2 | 20 | A-11 (Mw = 20,000) | spiro-OMeTAD (M = 1225.4) | 1:1 |
| Comparative Example 3 | 21 | A-11 (Mw = 20,000) | spiro-OMeTAD (M = 1225.4) | 1:1 |
| Comparative Example 4 | 22 | A-11 (Mw = 20,000) | spiro-OMeTAD (M = 1225.4) | 33:67 |

TABLE 3

| | Solar cell module | Initial characteristics | | | | Characteristics after continuous irradiation for 100 hours | | | | Maintenance rate of conversion efficiency (%) |
|---|---|---|---|---|---|---|---|---|---|---|
| | | Open-circuit voltage (V) | Density of short circuit current (mA/cm$^2$) | Shape factor | Conversion efficiency (%) | Open-circuit voltage (V) | Density of short circuit current (mA/cm$^2$) | Shape factor | Conversion efficiency (%) | |
| Example 1 | 1 | 6.09 | 3.29 | 0.66 | 13.2 | 6.05 | 3.13 | 0.66 | 12.5 | 94.7 |
| Example 2 | 2 | 6.13 | 3.27 | 0.65 | 13.0 | 6.05 | 3.13 | 0.65 | 12.3 | 94.6 |
| Example 3 | 3 | 6.18 | 3.19 | 0.66 | 13.0 | 6.06 | 3.08 | 0.65 | 12.1 | 93.1 |
| Example 4 | 4 | 6.02 | 3.34 | 0.66 | 13.3 | 5.94 | 3.24 | 0.64 | 12.3 | 92.5 |
| Example 5 | 5 | 6.15 | 3.21 | 0.64 | 12.6 | 6.09 | 3.11 | 0.64 | 12.1 | 96.0 |
| Example 6 | 6 | 6.18 | 3.17 | 0.63 | 12.3 | 6.05 | 3.09 | 0.62 | 11.6 | 94.3 |

TABLE 3-continued

| | Solar cell module | Initial characteristics | | | | Characteristics after continuous irradiation for 100 hours | | | | Maintenance rate of conversion efficiency (%) |
| | | Open-circuit voltage (V) | Density of short circuit current (mA/cm²) | Shape factor | Conversion efficiency (%) | Open-circuit voltage (V) | Density of short circuit current (mA/cm²) | Shape factor | Conversion efficiency (%) | |
|---|---|---|---|---|---|---|---|---|---|---|
| Example 7 | 7 | 6.09 | 3.22 | 0.63 | 12.4 | 5.98 | 3.14 | 0.63 | 11.8 | 95.2 |
| Example 8 | 8 | 6.22 | 3.19 | 0.66 | 13.1 | 5.95 | 3.07 | 0.65 | 11.9 | 90.7 |
| Example 9 | 9 | 6.31 | 3.33 | 0.65 | 13.7 | 6.09 | 3.19 | 0.64 | 12.4 | 91.0 |
| Example 10 | 10 | 6.35 | 3.24 | 0.66 | 13.6 | 6.11 | 3.13 | 0.65 | 12.4 | 91.5 |
| Example 11 | 11 | 6.34 | 3.19 | 0.67 | 13.6 | 6.09 | 3.09 | 0.65 | 12.2 | 90.3 |
| Example 12 | 12 | 6.07 | 3.07 | 0.64 | 11.9 | 6.03 | 2.99 | 0.6 | 10.8 | 90.7 |
| Example 13 | 13 | 6.04 | 3.2 | 0.63 | 12.2 | 6.03 | 3.07 | 0.59 | 10.9 | 89.7 |
| Example 14 | 14 | 6.03 | 3.16 | 0.64 | 12.2 | 5.98 | 3.04 | 0.59 | 10.7 | 88.0 |
| Example 15 | 15 | 6.15 | 3.19 | 0.66 | 12.9 | 5.97 | 3.04 | 0.66 | 12.0 | 92.5 |
| Example 16 | 16 | 6.18 | 3.2 | 0.65 | 12.9 | 5.95 | 3.11 | 0.65 | 12.0 | 93.6 |
| Example 17 | 17 | 6.22 | 3.24 | 0.65 | 13.1 | 6.11 | 3.17 | 0.64 | 12.4 | 94.6 |
| Example 18 | 18 | 6.19 | 3.13 | 0.64 | 12.4 | 6.05 | 2.89 | 0.61 | 10.7 | 86.0 |
| Comparative Example 1 | 19 | 6.11 | 3.27 | 0.65 | 13.0 | 5.64 | 2.75 | 0.58 | 9.0 | 69.2 |
| Comparative Example 2 | 20 | 6.14 | 3.29 | 0.64 | 12.9 | 5.58 | 2.79 | 0.56 | 8.7 | 67.4 |
| Comparative Example 3 | 21 | 6.12 | 3.19 | 0.64 | 12.5 | 5.61 | 2.58 | 0.56 | 8.1 | 64.8 |
| Comparative Example 4 | 22 | — | — | — | — | — | — | — | — | — |

From the results in Table 3, it is found that those in Examples 1 to 18 have a good durability because all of the maintenance rates of the conversion efficiency after the continuous irradiation test for 100 hours were 90% or more, and gold disposed as the second electrode and the hole transport layer were not exfoliated. Meanwhile, it is found that those in Comparative Examples 1 to 3 have a low durability because they include the same hole transport material as that of Example 1, but are modules formed of a continuous porous layer and a continuous perovskite layer. It was observed that gold disposed as the second electrode and the hole transport layer were exfoliated after continuous irradiation for 100 hours in the solar cell module 22 of Comparative Example 4.

As described above, in the solar cell module of the present disclosure, the hole transport layers are extended continuous layers in at least two photoelectric conversion elements adjacent to each other, and the first electrodes, the electron transport layers, and the perovskite layers in the at least two photoelectric conversion elements adjacent to each other are separated by the hole transport layer. As a result, the solar cell module of the present disclosure can maintain power generation efficiency even after exposure to light having a high illuminance for a long period of time.

Aspects of the present disclosure are as follows, for example.

<1> A solar cell module including:
a first substrate; and
a plurality of photoelectric conversion elements disposed on the first substrate, each of the plurality of photoelectric conversion elements including a first electrode, an electron transport layer, a perovskite layer, a hole transport layer, and a second electrode,
wherein, in at least two of the photoelectric conversion elements adjacent to each other, the hole transport layers are extended continuous layers, and wherein the first electrodes, the electron transport layers, and the perovskite layers in the at least two of the photoelectric conversion elements adjacent to each other are separated by the hole transport layer, and
the hole transport layer includes, as hole transport material, a polymer having a weight average molecular weight of 2,000 or more or a compound having a molecular weight of 2,000 or more.

<2> The solar cell module according to <1>,
wherein the polymer having a weight average molecular weight of 2,000 or more includes a recurring unit represented by General Formula (1) or (2) below:

[Chem. 31]

General Formula (1)

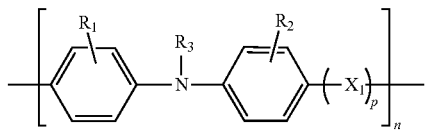

where, in the General Formula (1), $R_1$ and $R_2$, which may be identical to or different from each other, each represent at least one selected from the group consisting of a hydrogen atom, an alkyl group, an aralkyl group, an alkoxy group, and an aryl group, $R_3$ represents one selected from the group consisting of an alkyl group, an aralkyl group, an aryl group, and a heterocyclic group, $X_1$ represents one selected from the group consisting of an alkylene group, an alkenyl group, an alkynyl group, an aryl group, and a heterocyclic group, n represents an integer that is 2 or more and allows the polymer represented by the General Formula (1) to have a weight average molecular weight of 2,000 or more, and p represents 0, 1, or 2; and

[Chem. 32]

General Formula (2)

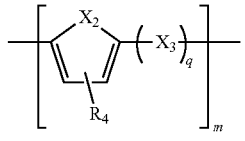

where, in the General Formula (2), $R_4$ represents one selected from the group consisting of a hydrogen atom, an alkyl group, an aralkyl group, an alkoxy group, and an aryl group, $X_2$ represents one selected from the group consisting of an oxygen atom, a sulfur atom, and a selenium atom, $X_3$ represents one selected from the group consisting of an alkenyl group, an alkynyl group, an aryl group, and a heterocyclic group, m represents an integer that is 2 or more and allows the polymer represented by the General Formula (2) to have a weight average molecular weight of 2,000 or more, and q represents 0, 1, or 2.

<3> A solar cell module including:

a substrate; and a plurality of photoelectric conversion elements disposed on the substrate, each of the plurality of photoelectric conversion elements including a first electrode, an electron transport layer, a perovskite layer, a hole transport layer, and a second electrode, wherein, in at least two of the photoelectric conversion elements adjacent to each other, the hole transport layers are extended continuous layers, and wherein the first electrodes, the electron transport layers, and the perovskite layers in the at least two of the photoelectric conversion elements adjacent to each other are separated by the hole transport layer, and the hole transport layer includes: a polymer including a recurring unit represented by General Formula (1) or (2) below and having a weight average molecular weight of 2,000 or more; or a compound having a molecular weight of 2,000 or more as a hole transport material:

[Chem. 33]

General Formula (1)

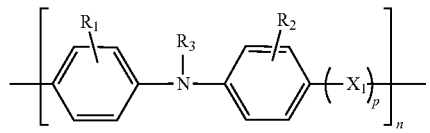

where, in the General Formula (1), $R_1$ and $R_2$, which may be identical to or different from each other, each represent at least one selected from the group consisting of a hydrogen atom, an alkyl group, an aralkyl group, an alkoxy group, and an aryl group, $R_3$ represents one selected from the group consisting of an alkyl group, an aralkyl group, an aryl group, and a heterocyclic group, $X_1$ represents one selected from the group consisting of an alkylene group, an alkenyl group, an alkynyl group, an aryl group, and a heterocyclic group, n represents an integer that is 2 or more and allows the polymer represented by the General Formula (1) to have a weight average molecular weight of 2,000 or more, and p represents 0, 1, or 2; and

[Chem. 34]

General Formula (2)

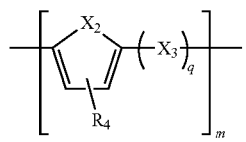

where, in the General Formula (2), $R_4$ represents one selected from the group consisting of a hydrogen atom, an alkyl group, an aralkyl group, an alkoxy group, and an aryl group, $X_2$ represents one selected from the group consisting of an oxygen atom, a sulfur atom, and a selenium atom, $X_3$ represents one selected from the group consisting of an alkenyl group, an alkynyl group, an aryl group, and a heterocyclic group, m represents an integer that is 2 or more and allows the polymer represented by the General Formula (2) to have a weight average molecular weight of 2,000 or more, and q represents 0, 1, or 2.

<4> The solar cell module according to <3>, wherein the compound having a molecular weight of less than 2,000 is one selected from the group consisting of spirobifluorene compounds, triarylamine compounds, and thiophene compounds.

<5> The solar cell module according to any one of <1> to <4>, wherein, in the at least two of the photoelectric conversion elements adjacent to each other, the first electrode in one photoelectric conversion element and the second electrode in other photoelectric conversion element are electrically connected to each other through a conduction part penetrating through the hole transport layer.

<6> The solar cell module according to any one of <1> to <5>, wherein, in the at least two of the photoelectric conversion elements adjacent to each other, a distance between the perovskite layer in one photoelectric conversion element and the perovskite layer in other photoelectric conversion element is 1 m or more but 100 m or less.

<7> The solar cell module according to any one of <1> to <6>, further including:

a second substrate disposed to face the first substrate so as to sandwich the plurality of photoelectric conversion elements; and a sealing member that is disposed between the first substrate and the second substrate and is configured to seal the plurality of photoelectric conversion elements.

<8> An electronic device including:

the solar cell module according to any one of <1> to <7>; and a device configured to be driven by electric power generated through photoelectric conversion of the solar cell module.

<9> An electronic device including:

the solar cell module according to any one of <1> to <7>;

a storage cell configured to store electric power generated through photoelectric conversion of the solar cell module; and a device configured to be driven by at least one of the electric power generated through photoelectric conversion of the solar cell module and the electric power stored in the storage cell.

<10> A power supply module including:

the solar cell module according to any one of <1> to <7>; and a power supply integrated circuit (IC).

The solar cell module according to any one <1> to <7>, the electronic device according to <8> or <9>, and the power supply module according to <10> can solve the existing problems in the art and can achieve the object of the present disclosure.

REFERENCE SIGNS LIST

1: first substrate
2, 2a, 2b: first electrode
3: compact electron transport layer (compact layer)
4: porous electron transport layer (porous layer)
5: perovskite layer
6: hole transport layer 7, 7a, 7b: second electrode
8: through part
9: sealing member
100 to 104: solar cell module
a, b: photoelectric conversion element

The invention claimed is:

1. A solar cell module, comprising:
a first substrate; and
a plurality of photoelectric conversion elements disposed on the first substrate, each of the plurality of photoelectric conversion elements including a first electrode, an electron transport layer, a perovskite layer, a hole transport layer, and a second electrode,
wherein, in at least two of the photoelectric conversion elements adjacent to each other, the hole transport layers are extended continuous layers, and wherein the first electrodes, the electron transport layers, and the perovskite layers in the at least two of the photoelectric conversion elements adjacent to each other are separated by the hole transport layer, and
wherein the hole transport layer includes: as hole transport materials, a polymer having a weight average molecular weight of 2,000 or more or a compound having a molecular weight of 2,000 or more; and a compound having a molecular weight of less than 2,000, and
said hole transport materials comprise the polymer having a weight average molecular weight of 2,000 or more or the compound having a molecular weight of 2,000 or more and the compound having a molecular weight of less than 2,000 in a mass ratio of 1:1 to 7:3.

2. The solar cell module according to claim 1, wherein the polymer having a weight average molecular weight of 2,000 or more includes a recurring unit represented by General Formula (1) or (2) below:

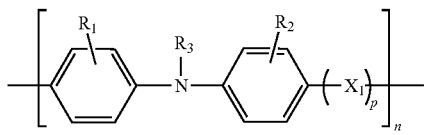

General Formula (1)

where, in the General Formula (1),
$R_1$ and $R_2$, which may be identical to or different from each other, each represent at least one selected from the group consisting of a hydrogen atom, an alkyl group, an aralkyl group, an alkoxy group, and an aryl group,
$R_3$ represents one selected from the group consisting of an alkyl group, an aralkyl group, an aryl group, and a heterocyclic group,
$X_1$ represents one selected from the group consisting of an alkylene group, an alkenyl group, an alkynyl group, an aryl group, and a heterocyclic group,
n represents an integer that is 2 or more and allows the polymer represented by the General Formula (1) to have a weight average molecular weight of 2,000 or more, and
p represents 0, 1, or 2; and

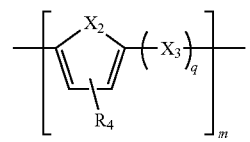

General Formula (2)

where, in the General Formula (2),
$R_4$ represents one selected from the group consisting of a hydrogen atom, an alkyl group, an aralkyl group, an alkoxy group, and an aryl group,
$X_2$ represents one selected from the group consisting of an oxygen atom, a sulfur atom, and a selenium atom,
$X_3$ represents one selected from the group consisting of an alkenyl group, an alkynyl group, an aryl group, and a heterocyclic group,
m represents an integer that is 2 or more and allows the polymer represented by the General Formula (2) to have a weight average molecular weight of 2,000 or more, and
q represents 0, 1, or 2.

3. The solar cell module according to claim 1, wherein the compound having a molecular weight of less than 2,000 is one selected from the group consisting of spirobifluorene compounds, triarylamine compounds, and thiophene compounds.

4. The solar cell module according to claim 1, wherein, in the at least two of the photoelectric conversion elements adjacent to each other, the first electrode in one photoelectric conversion element and the second electrode in other photoelectric conversion element are electrically connected to each other through a conduction part penetrating through the hole transport layer.

5. The solar cell module according to claim 1, wherein, in the at least two of the photoelectric conversion elements adjacent to each other, a distance between the perovskite layer in one photoelectric conversion element and the perovskite layer in other photoelectric conversion element is 1 μm or more but 100 μm or less.

6. The solar cell module according to claim 1, further comprising:
a second substrate disposed to face the first substrate so as to sandwich the plurality of photoelectric conversion elements; and
a sealing member that is disposed between the first substrate and the second substrate and is configured to seal the plurality of photoelectric conversion elements.

7. An electronic device, comprising:
the solar cell module according to claim 1; and
a device configured to be driven by electric power generated through photoelectric conversion of the solar cell module.

8. An electronic device, comprising:
the solar cell module according to claim 1;
a storage cell configured to store electric power generated through photoelectric conversion of the solar cell module; and
a device configured to be driven by at least one of the electric power generated through photoelectric conversion of the solar cell module and electric power stored in the storage cell.

9. A power supply module, comprising:
the solar cell module according to claim 1; and
a power supply integrated circuit (IC).

* * * * *